United States Patent
Nam et al.

(10) Patent No.: US 9,431,416 B2
(45) Date of Patent: Aug. 30, 2016

(54) VERTICAL-TYPE NONVOLATILE MEMORY DEVICE AND METHOD OF MANUFACTURING THE SAME

(71) Applicant: SAMSUNG ELECTRONICS CO., LTD., Suwon-Si, Gyeonggi-Do (KR)

(72) Inventors: Phil-ouk Nam, Gyeonggi-do (KR); Jun-kyu Yang, Seoul (KR); Hun-hyeong Lim, Gyeonggi-do (KR); Ki-hyun Hwang, Gyeonggi-do (KR); Jae-young Ahn, Gyeonggi-do (KR); Dong-chul Yoo, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/525,361

(22) Filed: Oct. 28, 2014

(65) Prior Publication Data

US 2015/0115348 A1   Apr. 30, 2015

(30) Foreign Application Priority Data

Oct. 28, 2013 (KR) .................. 10-2013-0128773

(51) Int. Cl.
| | | |
|---|---|---|
| H01L 21/02 | (2006.01) | |
| H01L 27/115 | (2006.01) | |
| H01L 29/792 | (2006.01) | |
| H01L 29/66 | (2006.01) | |

(52) U.S. Cl.
CPC ... *H01L 27/11582* (2013.01); *H01L 27/11524* (2013.01); *H01L 29/66666* (2013.01); *H01L 29/66833* (2013.01); *H01L 29/7926* (2013.01); *H01L 27/11575* (2013.01)

(58) Field of Classification Search
CPC .................. H01L 21/02636; H01L 21/32055; H01L 27/11582; H01L 29/7926; H01L 29/66833; H01L 29/66666
See application file for complete search history.

(56) References Cited

U.S. PATENT DOCUMENTS

| | | | |
|---|---|---|---|
| 8,445,347 B2 * | 5/2013 | Alsmeier | H01L 21/764 257/316 |
| 2009/0278193 A1 | 11/2009 | Murata et al. | |
| 2010/0276743 A1 | 11/2010 | Kuniya et al. | |
| 2011/0147824 A1 * | 6/2011 | Son | G11C 16/0483 257/324 |
| 2011/0303971 A1 * | 12/2011 | Lee | H01L 27/11551 257/324 |
| 2012/0168850 A1 | 7/2012 | Lee et al. | |
| 2012/0211821 A1 | 8/2012 | Matsumoto | |

(Continued)

FOREIGN PATENT DOCUMENTS

KR   1020120128438   11/2012

*Primary Examiner* — Mark Tornow

(74) *Attorney, Agent, or Firm* — F. Chau & Associates, LLC

(57) ABSTRACT

A vertical-type nonvolatile memory device includes a first vertical channel structure, and first and second stacked structure. The first vertical channel structure extends vertically on a substrate. The first stacked structure includes gate electrodes and first interlayer insulating layers. The gate layers and the first interlayer insulating layers are alternately and vertically stacked on each other. The first stacked structure is disposed on a first sidewall of the first vertical channel structure. The second stacked structure includes first sacrificial layers and second interlayer insulating layers. The first sacrificial layers and the second interlayer insulating layers are alternately and vertically stacked on each other. The second stacked structure is disposed on a second sidewall of the first vertical channel structure. The first sacrificial layers is formed of a polysilicon layer.

16 Claims, 23 Drawing Sheets

(56) References Cited

U.S. PATENT DOCUMENTS

| | | |
|---|---|---|
| 2012/0235221 A1 | 9/2012 | Ishiduki et al. |
| 2012/0267702 A1 | 10/2012 | Jee et al. |
| 2012/0273867 A1 | 11/2012 | Ko et al. |
| 2012/0280298 A1 | 11/2012 | Park et al. |
| 2012/0295409 A1 | 11/2012 | Yun et al. |
| 2013/0065386 A1* | 3/2013 | Kim .................... H01L 29/7926 438/591 |
| 2013/0100741 A1* | 4/2013 | Choi ................. H01L 27/11565 365/185.18 |
| 2014/0199815 A1* | 7/2014 | Hwang ............ H01L 29/66833 438/270 |

* cited by examiner

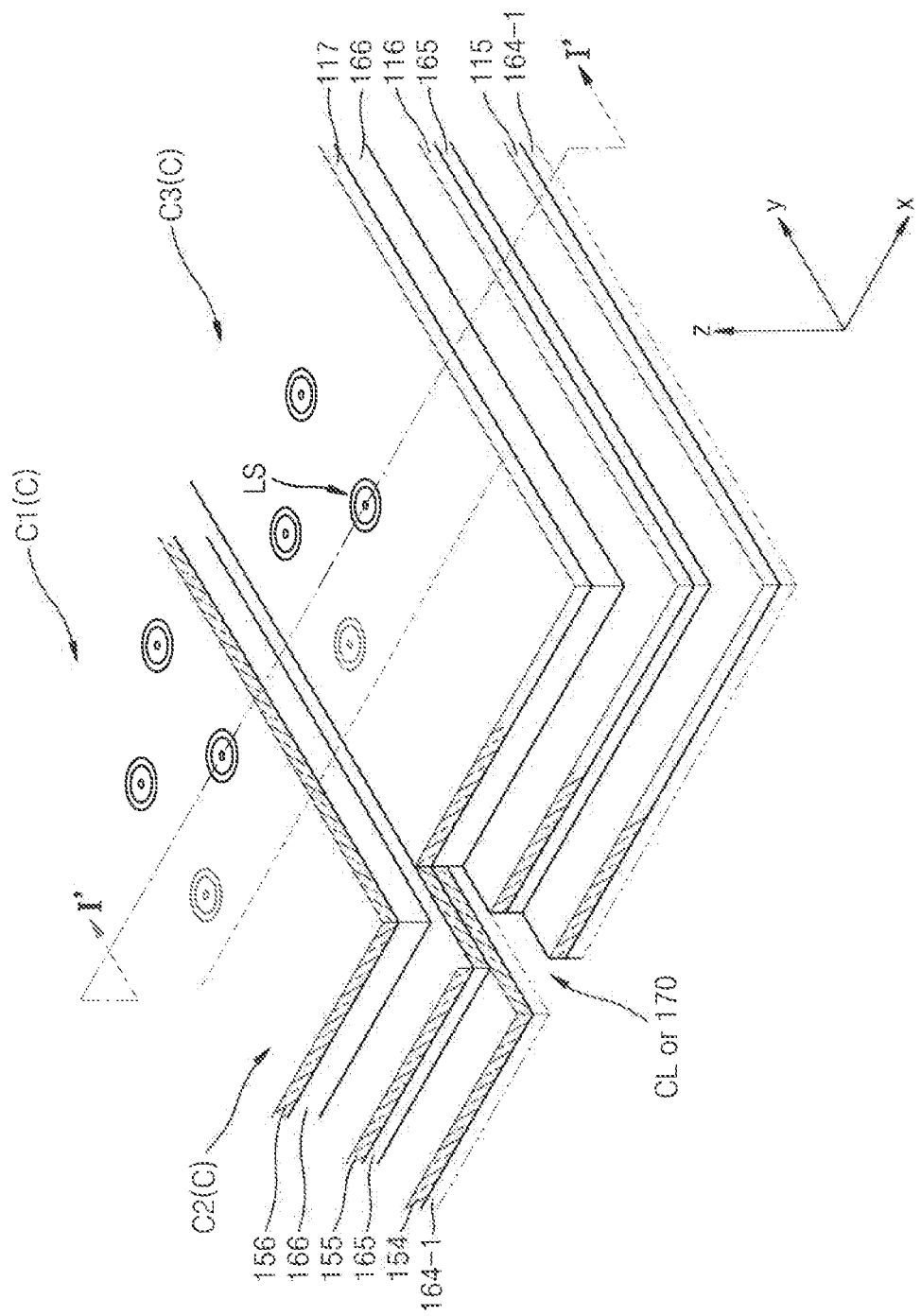

VERTICAL-TYPE NONVOLATILE MEMORY DEVICE AND METHOD OF MANUFACTURING THE SAME

CROSS-REFERENCE TO RELATED APPLICATION

This application claims priority under 35 U.S.C. §119 to Korean Patent Application No. 10-2013-0128773, filed on Oct. 28, 2013, in the Korean Intellectual Property Office, the disclosure of which is incorporated by reference herein in its entirety.

TECHNICAL FIELD

The present inventive concept relates to a nonvolatile memory device and a method of manufacturing the same.

DISCUSSION OF RELATED ART

Semiconductor memories include volatile memories such as dynamic random-access memories (DRAMs) and static RAMs (SRAMs), and nonvolatile memories such as electrically erasable programmable read-only memories (EEPROM), ferroelectric RAMs (FRAMs), phase-change RAMs (PRAMs), magnetic RAMs (MRAMs), and flash memories. Nonvolatile memories are used as storage for various consumer electronic products such as MP3 players, digital cameras, mobile phones, camcorders, flash cards, and solid state disks (SSDs).

As such electronic products demand more storage, nonvolatile memories may have a vertical cell structure to integrate more memory cells per unit area.

SUMMARY

According to an exemplary embodiment of the present inventive concept, a vertical-type nonvolatile memory device includes a first vertical channel structure, and first and second stacked structure. The first vertical channel structure extends vertically on a substrate. The first stacked structure includes gate electrodes and first interlayer insulating layers. The gate layers and the first interlayer insulating layers are alternately and vertically stacked on each other. The first stacked structure is disposed on a first sidewall of the first vertical channel structure. The second stacked structure includes first sacrificial layers and second interlayer insulating layers. The first sacrificial layers and the second interlayer insulating layers are alternately and vertically stacked on each other. The second stacked structure is disposed on a second sidewall of the first vertical channel structure. The first sacrificial layers is formed of a polysilicon layer.

According to an exemplary embodiment of the present inventive concept, a vertical-type nonvolatile memory device includes a cell region. The cell region includes a device region, a dummy region and an isolation insulating layer. The cell region includes a plurality of gate electrodes and a plurality of first interlayer insulation layers that are vertically and alternately stacked on each other. The dummy region is adjacent to one side of the device region, and the dummy region includes a plurality of conductive layers and a plurality of second interlayer insulating layers that are vertically and alternately stacked on each other. A material of the plurality of conductive layers is different from a material of the plurality of gate electrodes. A material of the plurality of first interlayer insulating layers is substantially the same as a material of the plurality of second interlayer insulating layer. The isolation insulating layer is interposed between the device region and the dummy region.

According to an exemplary embodiment of the present inventive concept, a method of manufacturing a vertical nonvolatile memory device is provided. A first stacked layer is formed on a substrate. The first stacked layer includes a first interlayer insulating layer and a first sacrificial layer that are alternately stacked on each other. A second stacked layer is formed on the first stacked layer. The second stacked layer includes a second interlayer insulating layer and a second sacrificial layer that are alternately stacked on each other. The first interlayer insulating layer is formed of at least one of oxide or nitride and the second sacrificial layer is formed of polysilicon.

BRIEF DESCRIPTION OF THE DRAWINGS

These and other features of the inventive concept will become more apparent by describing in detail exemplary embodiments thereof with reference to the accompanying drawings of which:

FIG. 3A is a perspective view of a connection region and a dummy region of a cell region of the vertical-type non-volatile memory device of FIG. 2;

DETAILED DESCRIPTION OF EXEMPLARY EMBODIMENTS

Figure 1:
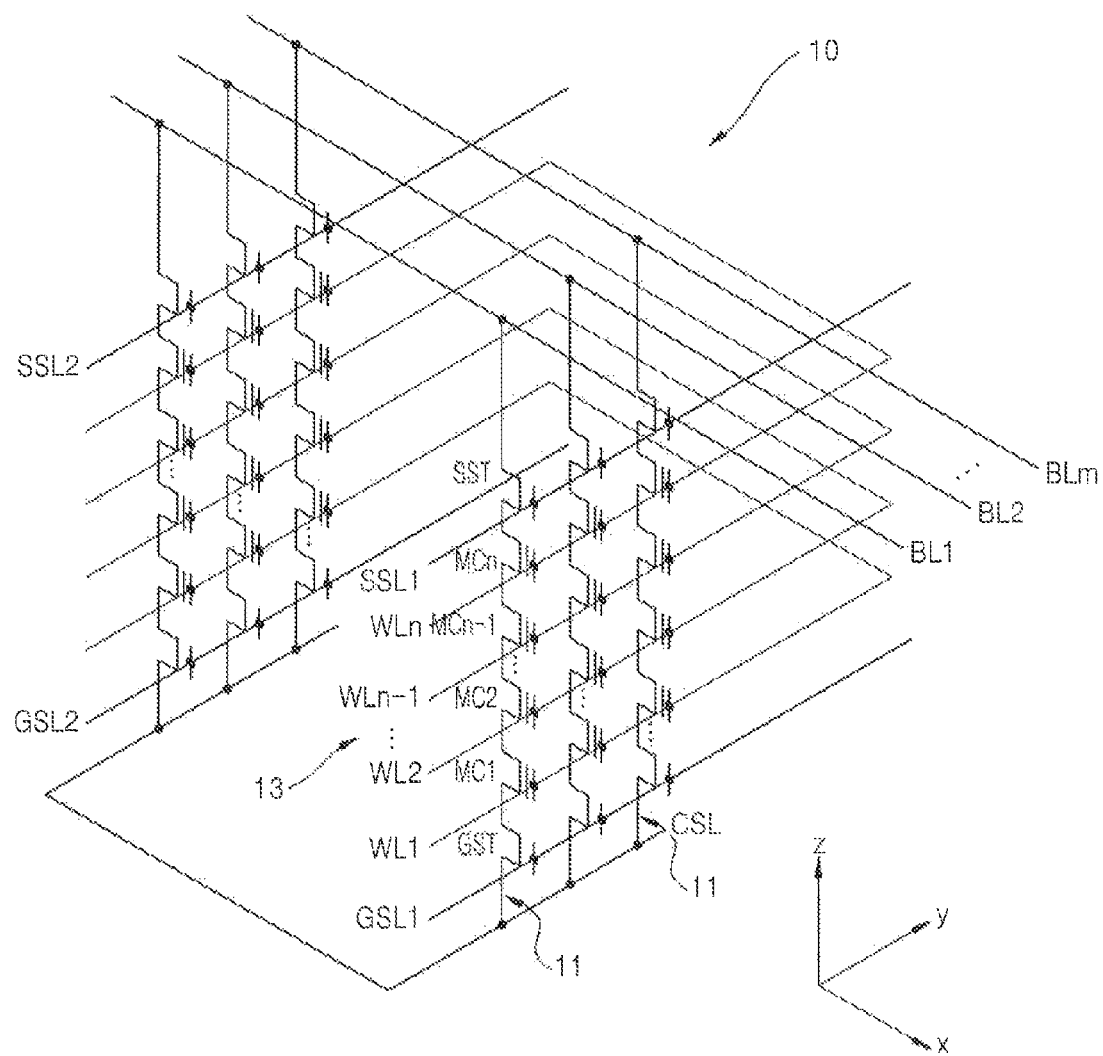
FIG. 1 is circuit diagram of a memory cell array of a vertical-type nonvolatile memory device according to an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is circuit diagram of a memory cell array 10 of a vertical-type nonvolatile memory device according to an exemplary embodiment of the inventive concept. In particular, FIG. 1 is circuit diagram of a vertical-type NAND flash memory device having a vertical channel structure.

Referring to FIG. 1, the memory cell array 10 may include memory cell strings 11. Each of the memory cell strings 11 may have a vertical structure that extends in a vertical direction (z direction) with respect to an extension direction (x and y directions) that is parallel to a main surface of a substrate (not illustrated). A memory cell block 13 may be constituted by memory cell strings 11.

Each of the memory cell strings 11 may include memory cells MC1, MC2, . . . , MCn−1, MCn, a string selection transistor SST, and a ground selection transistor GST. In each of the memory cell strings 11, the ground selection transistor GST, the memory cells MC1, MC2, . . . , MCn−1, MCn, and the string selection transistor SST may be disposed in series in the vertical direction (z direction). The memory cells MC1, MC2, . . . , MCn−1, MCn may store data. Word lines WL1, WL2, . . . , WLn−1, WLn may be included in the memory cells MC1, MC2, . . . , MCn−1, MCn and may control the memory cells MC1, MC2, . . . , MCn−1, MCn. The number of memory cells MC1, MC2, . . . , MCn−1, MCn may be selected suitably according to the storing capacity of a semiconductor memory device.

Bit lines BL1, BL2, . . . , BLm extending in the x direction may be connected to one side of the memory cell strings 11 arranged at first to $m_{th}$ columns, for example, to a drain of the string selection transistor SST. Also, a common source line CSL may be connected to the other side of each memory cell string 11, for example, to a source of the ground selection transistor GST.

A word line (for example, WL1) extending in the y direction may be connected in common to gate electrodes of memory cells arranged in the same layer (for example, the memory cells arranged in the same layer as MC1), among the memory cells MC1, MC2, . . . , MCn−1, MCn of the memory cell strings 11. According to the driving of the word lines WL1, WL, . . . , WLn−1, WLn, data may be programmed/read or erased into/from the memory cells MC1, MC2, . . . , MCn−1, MCn.

In each memory cell string 11, the string selection transistor SST may be disposed between the bit line (for example, BL1) and the uppermost memory cell MCn. Each string selection transistor SST in the memory cell block 13 may control data transmission between the bit lines BL1, BL2, . . . , BLm and the memory cells MC1, MC2, . . . , MCn−1, MCn by a string selection line SSL connected to a gate electrode of the string selection transistor SST.

The ground selection transistor GST may be disposed between the lowermost memory cell MC1 and the common source line CSL. Each ground selection transistor GST in the memory cell array 10 may control data transmission between the common source line CSL and the memory cells MC1, MC2, . . . , MCn−1, MCn by a ground selection line GSL connected to a gate electrode of the ground selection transistor GST.

At least some of the gate electrodes of the memory cells may be formed of a polysilicon layer as a sacrificial layer. Accordingly, the total height of the memory device is reduced and a misalignment thereof is minimized, thereby making it possible to implement a vertical-type nonvolatile memory device that is highly integrated and reliable.

Figure 2:
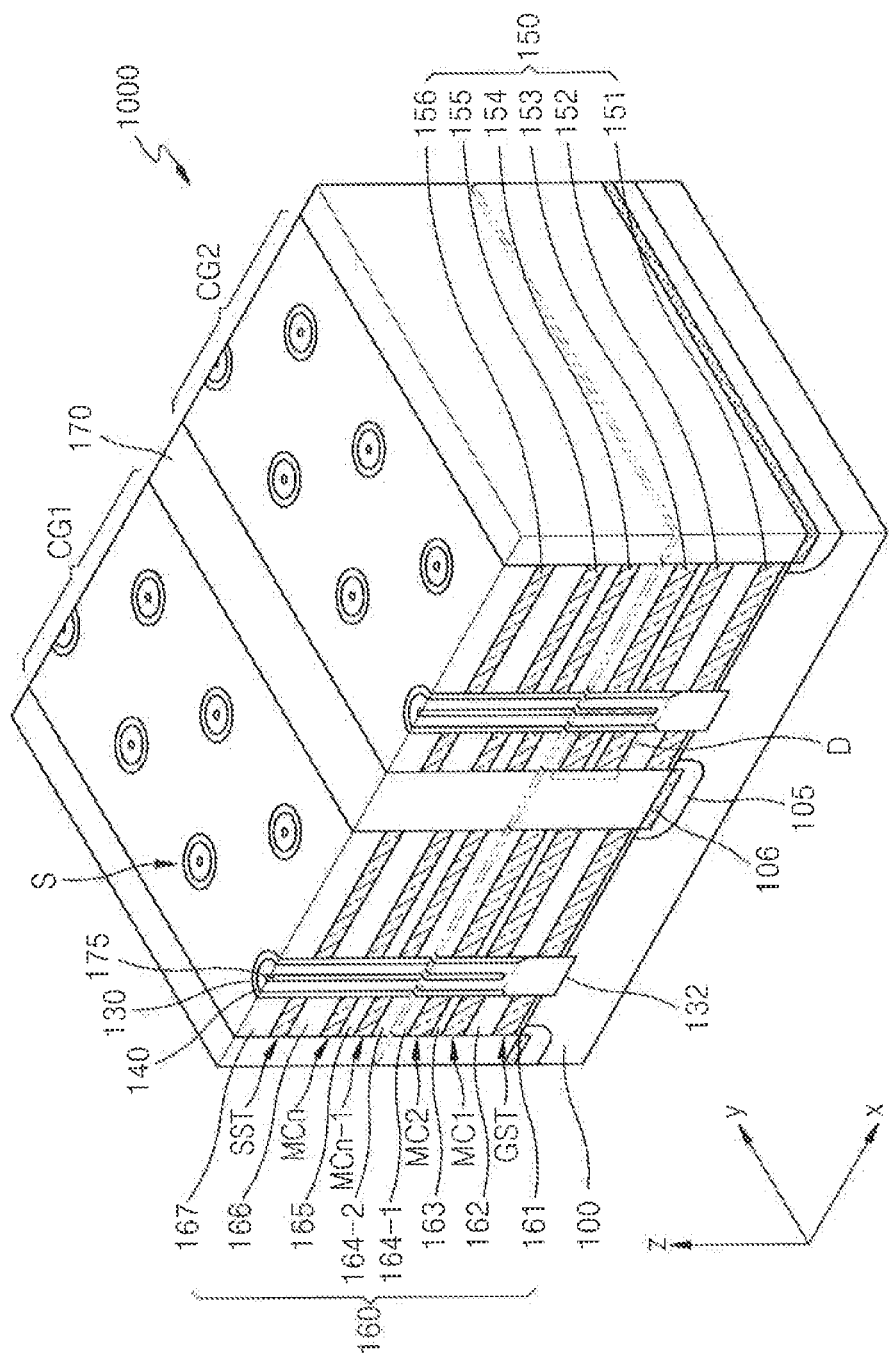
FIG. 2 is a schematic perspective view of a three-dimensional (3D) structure of memory cell strings of a vertical-type nonvolatile memory device according to an exemplary embodiment of the inventive concept.

FIG. 2 is a schematic perspective view of a three-dimensional (3D) structure of memory cell strings of a vertical-type nonvolatile memory device 1000 according to an exemplary embodiment of the inventive concept. In FIG. 2, the illustration of some elements constituting the memory cell string 11 of FIG. 1 may be omitted. For example, the illustration of the bit line of the memory cell string 11 is omitted.

Referring to FIG. 2, the nonvolatile memory device 1000 may include cell string array group regions CG1 and CG2 that are disposed on a substrate 100. The cell string array group regions CG1 and CG2 may be isolated by an isolation insulating layer 170. Memory cell strings (11 or FIG. 1) may be disposed in each of the cell string array group regions CG1 and CG2. Each of the memory cell strings may include memory cells MC1, MC2, . . . , MCn−1, MCn that are disposed along a sidewall of a channel region 130. The memory cell strings may be arranged in the y direction. As illustrated in FIG. 2, memory cell strings 11 (see FIG. 1) extending in the z direction from the substrate 100 may be arranged along a side surface of the channel region 130. Each memory cell string 11 may include a ground selection transistor GST, memory cells MC1, MC2, . . . , MCn−1, MCn, and a string selection transistor SST. Ground and string selection transistors may be formed of two transistors.

The substrate 100 may have a main surface that extends in the x direction and the y direction. The substrate 100 may include a semiconductor material, for example, a Group IV semiconductor, a Group III-V compound semiconductor, or a Group II-VI oxide semiconductor. For example, the Group IV semiconductor may include silicon, germanium, or silicon-germanium. The substrate 100 may be provided as a bulk wafer or an epitaxial layer.

The channel region 130 may extend in the z direction on the substrate 100. The channel regions 130 may be apart from each other in the x direction and the y direction, and may be arranged in a zig-zag configuration in the y direction. For example, two rows of channel regions 130 may be arranged in a zig-zag configuration in the y direction. For example, among the two rows of channel regions 130, the channel regions 130 that are most adjacent in the y direction may be disposed in an offset manner in the x direction. Although the channel regions 130 are illustrated as being arranged in two rows in an offset manner, the present exemplary embodiment is not limited thereto. For example, three or more rows of channel regions 130 may be arranged in an offset manner in a zig-zag configuration, or only one row of channel regions 130 may be arranged. For example, the channel region 130 may be formed in an annular shape. However, the present exemplary embodiment is not limited thereto, and the channel region 130 may be formed in a circular or square pillar shape, or the channel region 130 may be formed only at both side surfaces and a bottom surface of a square pillar.

The channel region 130 may be electrically connected to the substrate 100 by directly contacting the substrate 100 at a bottom surface thereof. For example, the channel region 130 may be connected to the substrate 100 through a selective epitaxial growth (SEG) layer 132 (see FIG. 10D) that is formed by a SEG process on the substrate 100.

The channel region 130 may include a semiconductor material such as polysilicon or monocrystalline silicon, and the semiconductor material may not be doped or may include a p-type or n-type dopant. A buried insulating layer 175 having a circular pillar structure may be formed in the channel region 130. The buried insulating layer 175 may be omitted and the channel region 130 may be completely filled. The channel regions 130 of the cell string array group regions CG1 and CG2 are disposed asymmetrically with respect to the isolation insulating layer 170. The present inventive concept is not limited thereto. For example, the channel regions 130 of the cell string array group regions CG1 and CG2 may be disposed symmetrically with respect to the isolation insulating layer 170.

A bit line BL may be connected to a drain of the string selection transistors SST that are arranged in the x direction. For example, the bit line BL may include a line-shaped pattern extending in the x direction, and may be electrically connected to the string selection transistors SST through the channel region 130 or a bit line contact plug (not illustrated) that is formed on a conductive layer connected to the channel region 130. Each of the ground selection transistors GST arranged in the x direction may be electrically connected to a doped region 105 that is adjacent thereto.

The doped regions 105 may be apart from each other in the x direction while being adjacent to the main surface of the substrate 100 and extending in the y direction. The doped region 105 may be disposed between every two channel regions 130 in the x direction. The doped region 105 may be a source region, and may form a PN junction with another region of the substrate 100. The doped region 105 may include a heavily-doped region (not illustrated) that is adjacent to the main surface of the substrate 100 and is located at a center thereof, and a lightly-doped region (not illustrated) that is disposed at both ends of the heavily-doped region.

A common source line 106 may be formed on the doped regions 105. The common source line 106 may be formed of metal silicide, for example, cobalt silicide ($CoSi_x$). Also, the common source line 106 may include metal silicide and a metal layer that is formed on the metal silicide. The metal layer may be formed of tungsten (W), aluminum (Al), or copper (Cu). The common source line 106 may be formed to have various structures. For example, the common source line 106 may be formed only at a portion on the doped regions 105 along the y direction. The common source line 106 may be formed at the entire portion on the doped regions 105 along the y direction. Spacers may be formed at a sidewall of a gate electrode 151 of the ground selection transistor GST, and a metal layer may be formed to a predetermined height between the spacers to form a common source line. In addition, the spacers may extend to the uppermost interlayer insulating layer 167, and a metal layer may be formed between the spacers to form a common source line.

The isolation insulating layer 170 may be formed on the common source line 106. For example, the isolation insulating layer 170 may be formed between the adjacent memory cell strings that use different channel regions 130.

Gate electrodes 150 (151 to 156) may be spaced apart in the z direction from the substrate 100 along the side surface of the channel region 130. The gate electrodes 150 may be gates of the ground selection transistor GST, the memory cells MC1, MC2, . . . , MCn−1, MCn, and the string selection transistor SST. The gate electrodes 150 may be connected in common to the adjacent memory cell strings that are arranged in the y direction.

The gate electrode 156 of the string selection transistor SST may be connected to the string selection line SSL (see FIG. 1). The gate electrodes 152, 153, 154, and 155 of the memory cells MC1, MC2, . . . , MCn−1, MCn may be connected to the word lines WL1, WL2, W . . . , Ln−1, WLn (see FIG. 1). The gate electrode 151 of the ground selection transistor GST may be connected to the ground selection line GSL (see FIG. 1). The gate electrodes 150 may be formed of a metal, for example, tungsten (W). Although not illustrated, the gate electrodes 150 may further include a diffusion barrier (not illustrated). For example, the diffusion barrier may include at least one of tungsten nitride (WN), tantalum nitride (TaN), and titanium nitride (TiN).

Figure 4A:
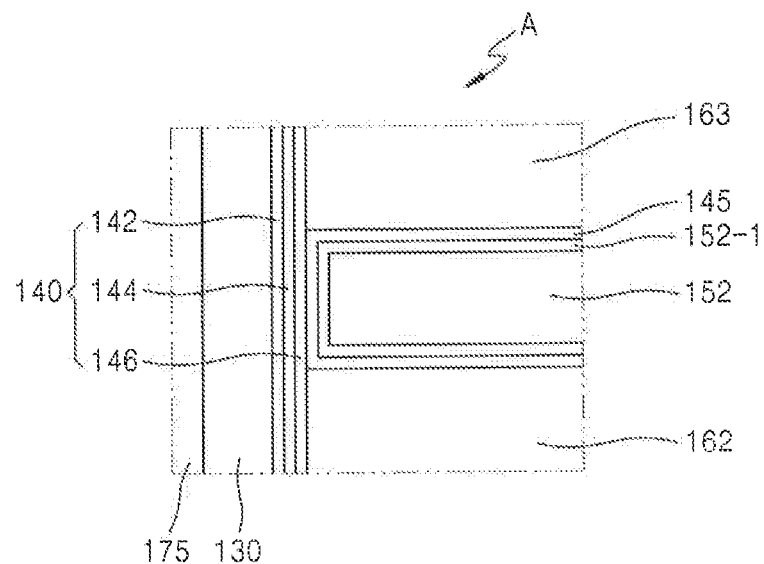
FIGS. 4A and 4B are expanded cross-sectional views of portions A and B of FIG. 3C.

An insulating layer (not shown) may be interposed between the gate electrode 151 and the SEG layer 132. For example, the insulating layer may be formed of an upper insulating layer 145 that is a portion of a gate dielectric layer, as shown in FIG. 4A. The upper insulating layer may be formed of $Al_2O_3$.

In the nonvolatile memory device 1000 of the present exemplary embodiment, at least a portion of the gate electrodes 150 may be formed by using a polysilicon layer as a sacrificial layer. For example, at least a portion of the gate electrodes 150 may be formed by forming a polysilicon layer as a sacrificial layer, removing the polysilicon layer by using a halogen-containing reaction gas, and filling a space left due to a removed portion with a metal layer such as a tungsten layer, or may be formed of metal silicide (for example, nickel silicide) by using a partially-left polysilicon layer. All the gate electrodes 150 may be formed by using a polysilicon layer as a sacrificial layer. This will be described later in more detail with reference to FIGS. 10A to 11F.

A gate dielectric layer 140 may be disposed between the channel region 130 and the gate electrodes 150. Although not illustrated in FIG. 2, the gate dielectric layer 140 may include a tunneling insulating layer, a charge storage layer, and a blocking insulating layer that are stacked sequentially from the channel region 130.

The tunneling insulating layer may tunnel charges into the charge storage layer by a Fowler-Nordheim (FN) method. For example, the tunneling insulating layer may include silicon oxide. The charge storage layer may include a charge trap layer. The charge storage layer may include quantum dots or nanocrystals. For example, the quantum dots or the nanocrystals may include metal or semiconductor particles. The blocking insulating layer may include a high-dielectric (high-k) material. The high-k material refers to a dielectric material that has a higher dielectric constant than silicon oxide.

For example, the gate dielectric layer 140 may be formed of any one of an oxide-nitride-oxide (ONO) layer, an oxide-nitride-alumina (ONA) layer, and an oxide-nitride-oxide-alumina (ONOA) layer. Alumina ($Al_2O_3$) may be formed as the upper insulating layer 145 configured to cover the gate electrodes 150, as illustrated in FIG. 4A.

The channel region 130, the gate dielectric layer 140, and the buried insulating layer 175 may constitute a vertical channel structure S.

Interlayer insulating layers 160 (161 to 167) may be arranged between the gate electrodes 150. Like the gate electrodes 150, the interlayer insulating layers 160 may be arranged apart from each other in the z direction and extend in the y direction. One side surface of the interlayer insulating layers 160 may contact the channel region 130. The interlayer insulating layers 160 may include silicon oxide or a silicon nitride.

In FIG. 2, one string selection transistor SST and one ground selection transistor GST of the memory cell strings are arranged. However, the inventive concept is not limited thereto. For example, the string selection transistor SST and the ground selection transistor GST may include two or more transistors to reduce the gate length of the select gate electrodes, so that a space between the interlayer insulating layers 160 may be completely filled. Also, the string selection transistor SST and the ground selection transistor GST may have a different structure than the memory cells MC1, MC2, MCn−1, and MCn.

At least a portion of the gate electrodes 150 is formed through a metal replacement process using a polysilicon layer, thereby reducing the total height of the nonvolatile memory device 1000 and minimizing a misalignment thereof. Accordingly, it is possible to implement a vertical-type nonvolatile memory device that is highly integrated and reliable.

The reduction of the height of the nonvolatile memory device 1000 and the minimization of the misalignment thereof may be achieved by using a polysilicon layer as a sacrificial layer. Since the polysilicon layer has high etch selectivity compared with a interlayer insulating layer, the interlayer insulating layer need not be damaged when the polysilicon layer is removed. Thus, the total height of the memory device may be reduced by forming the interlayer insulating layers to be thin when stacking the sacrificial layers and the interlayer insulating layers alternately on the substrate. Also, a stack structure of an oxide layer and a polysilicon layer may be subject to smaller thermal stress than a stack structure of an oxide layer and a nitride layer. Due to the smaller thermal stress, the warpage or distortion of the stack structure may be reduced, thereby minimizing the misalignment thereof.

FIG. 3A is a perspective view of a connection region and a dummy region of a cell region of the nonvolatile memory device 1000 of FIG. 2. Although a structure in which an isolation insulating layer 170 is formed after a metal replacement process is illustrated (see FIG. 3C), the illustration of the isolation insulating layer 170 is omitted for the convenience of description.

Referring to FIG. 3A, the nonvolatile memory device 1000 may include a cell region C. The cell region C may correspond to a memory cell block 13 of FIG. 1. The cell region C may include a device region C1, a connection region C2, and a dummy region C3.

The device region C1 may be a region in which a string selection transistor, memory cells, and a ground selection transistor constituting the above-described memory cell strings are formed. Bit lines may be disposed on the device region C1, and doped regions and common source lines may be formed under the device region C1.

Figure 3B:
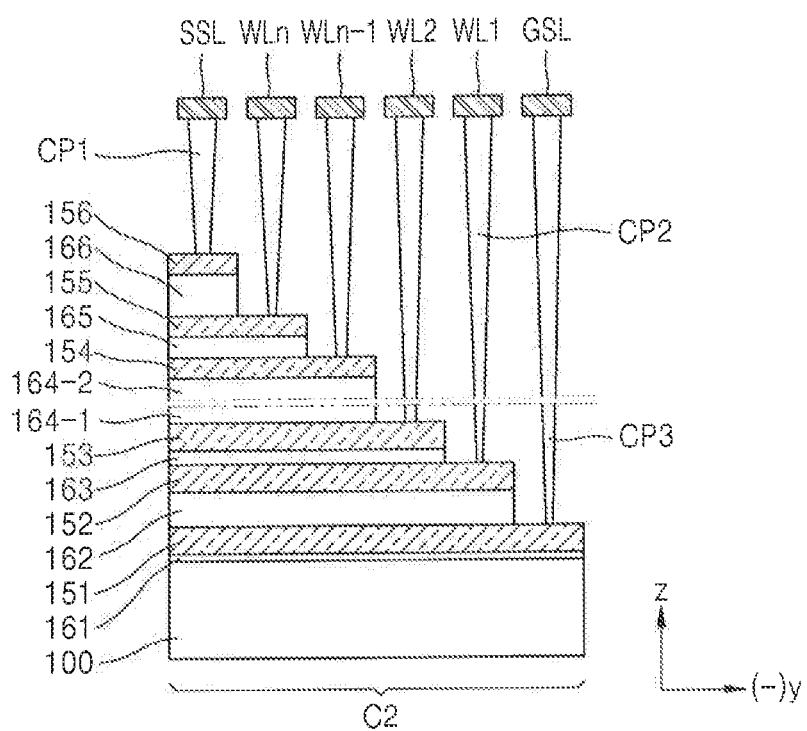
FIG. 3B is a cross-sectional view of a state in which a gate electrode is connected to a word line through a vertical contact in the connection region of the vertical-type non-volatile memory device.

The connection region C2 may be a region in which gate electrodes of a string selection transistor, memory cells, and a ground selection transistor extend from the device region C1 and may be connected to the ground selection line GSL, the word lines WL1, WL2, WLn−1, and WLn, and the string selection line SSL through vertical contacts CP1, CP2, and CP3 (see FIG. 3B). As illustrated in FIG. 3A, the connection region C2 may be in the shape of a stair structure so that the connection region C2 may be easily connected to the word lines WL1, WL2, WLn−1, and WLn.

The dummy region C3 may be a region that is formed outside the device region C1. A cell string having the same structure as the memory cell string of the device region C1 may be formed in the dummy region C3. A vertical channel structure LS is disposed at an outermost portion in the x direction. The vertical channel structure LS will be described later in more detail with reference to FIG. 3C. As in the connection region C2, a stair structure may be formed in the dummy region C3. The dummy region C3 may protect the device region C1. The dummy region C3 may be formed in the shape of a stair structure simultaneously when the connection region C2 is formed in the shape of a stair structure. For example, when the connection region C2 is formed in the shape of a stair structure, it may be easier to form one side surface in the shape of stair structure together with another adjacent surface than to form only one side surface in the shape of stair structure, due to the characteristics of a photolithography process.

A portion of the dummy region C3 may be relatively distant from a portion in which the isolation insulating layer 170 is formed, for example, a cutting line CL that isolates the gate electrodes from each other, so that a sacrificial layer may remain without being removed in a metal replacement process. Thus, sacrificial layers may be left in the dummy region C3 even after the completion of a memory device manufacturing method. The sacrificial layers left in the dummy region C3 does not affect the performance of the memory device.

For example, the sacrificial layers adjacent to the cutting line CL or the isolation insulating layer 170 are replaced with metal gate electrodes 154, 155, and 156 through the metal replacement process. However, the remaining portion of the sacrificial layer 115, 116 and 117 may be left. As such, the metal gate electrodes 154, 155 and 156 may be disposed only between the cutting line CL or the isolation insulating layer 170 and the vertical structure LS, and the remaining portion of the sacrificial layer 115, 116 and 117 may be positioned at the right to the vertical structure LS. The remaining sacrificial layers 115, 116, and 117 are maintained distant from the cutting line CL in the x direction.

According to an exemplary embodiment, the sacrificial layers to form gate electrodes may be left in the dummy region C3.

FIG. 3B is a cross-sectional view of a state in which a gate electrode is connected to a word line through a vertical contact in the connection region C2 of the nonvolatile memory device 1000.

Referring to FIG. 3B, the gate electrodes 151, 152, 153, 154, 155, and 156 may extend to the connection region C2. The extended gate electrodes 151, 152, 153, 154, 155, and 156 may be connected to the ground selection line GSL, the word lines WL1, WL2, WLn−1, and WLn, and the string selection line SSL through the vertical contacts CP1, CP2, and CP3 in the connection region C2.

For example, the first vertical contact CP1 may connect the gate electrode 156 of the string selection transistor SST to the string selection line SSL, the second vertical contacts CP2 may connect the gate electrodes 152, 153, 154, and 155 of the memory cells MC1, MC2, MCn−1, and MCn to the word lines WL1, WL2, WLn−1, and WLn, and the third vertical contact CP3 may connect the gate electrode 151 of the ground selection transistor GST to the ground selection line GSL.

Figure 3C:
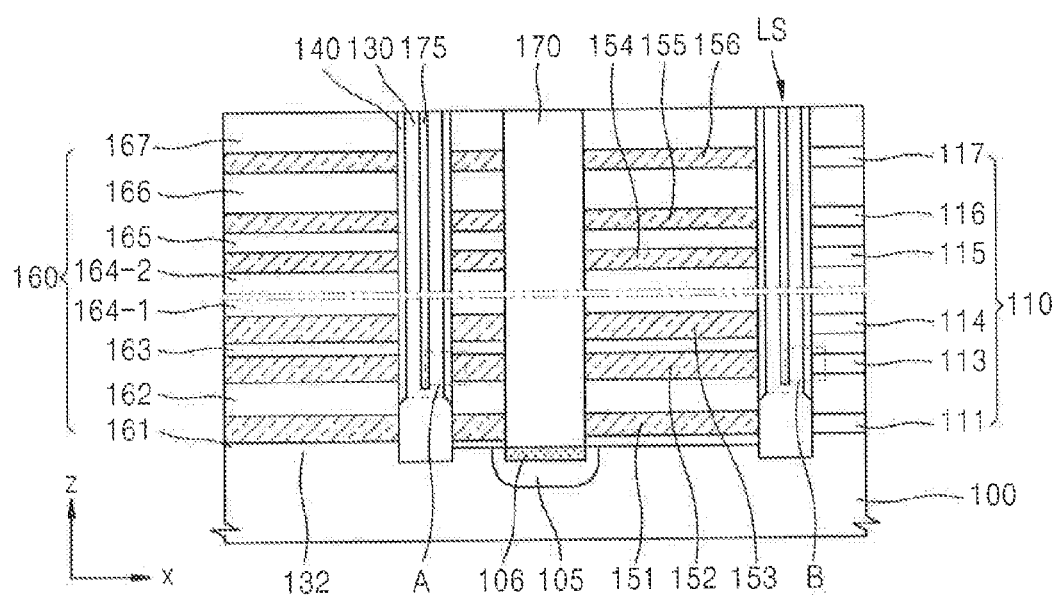
FIG. 3C is a cross-sectional view taken along line I-I' of FIG. 3A.

FIG. 3C is a cross-sectional view taken along line I-I' of FIG. 3A. For the convenience of description, the description made above with reference to FIG. 2 will be omitted or briefly described.

Referring to FIG. 3C, the outermost vertical channel structure LS of the dummy region C3 may include a channel region 130, a gate dielectric layer 140, and a buried insulating layer 175. The outermost vertical channel structure LS may include transistors of memory cells as in the vertical channel structure S (see FIG. 2) of the device region C1, or need not include transistors of memory cells due to the positional characteristics thereof. The vertical channel structure LS may interchangeably referred to as the For example, the gate electrodes 150 formed in the outermost vertical channel structure LS may be incomplete to serve as a gate electrode of a transistor. For example, the gate electrode 150 formed in the outermost vertical channel structure LS is not in contact with the vertical channel structure LS. In a metal replacement process that will described later with reference to FIGS. 10A to 10K, the outermost vertical channel structure LS is too distant from the region of the cutting line CL and thus the sacrificial layers between the outermost vertical channel structure LS and the cutting line CL may remain without being replaced with corresponding gate electrodes. Accordingly, the gate electrodes 150 adjacent to the outermost vertical channel structure LS may be incomplete.

For example, the gate electrodes 150 that are adjacent to the left of the outermost vertical channel structure LS may serve as a gate electrode of a transistor, and the gate electrodes 150 that are adjacent to the right of the outermost vertical channel structure LS do not serve as a gate electrode of a transistor because the sacrificial layers 110 (111 and 113 to 117) remain in the right side of the outermost vertical channel structure LS. Alternatively, the gate electrodes 150 adjacent to the right and left to the outermost vertical channel structure LS do not serve as a gate electrode of a transistor due to their incomplete formation in a metal replacement process.

The structures of the sacrificial layers and the gate electrodes around the outermost vertical channel structure LS may depend on how distant the outermost vertical channel structure LS is from the cutting line CL and under what process conditions the metal replacement process is performed.

The material of the gate electrodes 150 in the dummy region C3 may be different from the material of the gate electrodes 150 in the device region C1. While the gate electrodes 150 in the device region C1 may be a metal electrode, the gate electrodes 150 in the dummy region C3 may be an electrode including a metal layer and a polysilicon layer.

When the gate electrodes 150 in the device region C1 are a metal silicide electrode, the gate electrodes 150 in the dummy region C3 may be an electrode including a metal silicide layer and a polysilicon layer.

Also, the dummy region C3 may include gate electrodes 150 in which a first conductive layer and a second conductive layer are disposed in parallel on the same plane. For example, the first conductive layer may include a metal layer, and the second conductive layer may include a polysilicon layer. Alternatively, the first conductive layer may include a metal silicide layer, and the second conductive layer may include a metal silicide layer and a polysilicon layer.

The upper sacrificial layers 115, 116, and 117 may be different from the lower sacrificial layers 111, 113, and 114. For example, the lower sacrificial layers 111, 113, and 114 may be formed of a nitride layer or an oxide layer, and the upper sacrificial layers 115, 116, and 117 may be formed of a polysilicon layer. Alternatively, the lower sacrificial layers 111, 113, and 114 may be formed of a polysilicon layer, and the upper sacrificial layers 115, 116, and 117 may be formed of a silicon oxide layer. Due to the difference in the kind of the sacrificial layers 110, the thickness of the lower gate electrodes 151, 152, and 153 may be greater than the thickness of the upper gate electrodes 154, 155, and 156 after the metal replacement process. A portion of the interlayer insulating layers 160 is also removed since etch selectivity of the interlayer insulating layers 160 is not high when the lower sacrificial layers 111, 113, and 114 formed of a nitride layer or an oxide layer are removed. Alternatively, the thicknesses of the upper and lower gate electrodes 151 to 156 may be substantially the same. For example, by reducing the sacrificial layers 111, 113, and 114 instead of increasing the thickness of the lower interlayer insulating layers 160 in consideration of etch selectivity, the thicknesses of the upper and lower gate electrodes 151 to 156 may be formed to have substantially the same after a metal replacement process.

The thicknesses of the gate electrodes 150 and the sacrificial layers 110 will be described later in more detail with reference to FIGS. 5 and 6 and FIGS. 10A to 10K.

Using difference in etch selectivity between the sacrificial layers 110 and the interlayer insulating layers 160, the total height of the nonvolatile memory device 1000 may be reduced, thereby minimizing warpage in the substrate 100 thereof. Warpage of the substrate 100 may cause misalignment in a photolithography process. Accordingly, it is possible to implement a vertical-type nonvolatile memory device that is highly integrated and reliable.

For example, the sacrificial layers 115 to 117 may be formed of polysilicon, and the sacrificial layers 111 to 114 may be formed of silicon oxide or silicon nitride. Etch selectivity of silicon with respect to the interlayer insulating layers 160 is higher than each selectivity of silicon oxide or silicon nitride with respect to the interlayer insulating layer 160. Since reactive etchants may flow into the above of the substrate 100, the arrival rate of the reactive etchants is higher at the sacrificial layers 115 to 117 than at the sacrificial layers 111 to 114. As such, the sacrificial layers 115 to 117 may be thinner than the sacrificial layers 111 to 114.

Figure 4B:
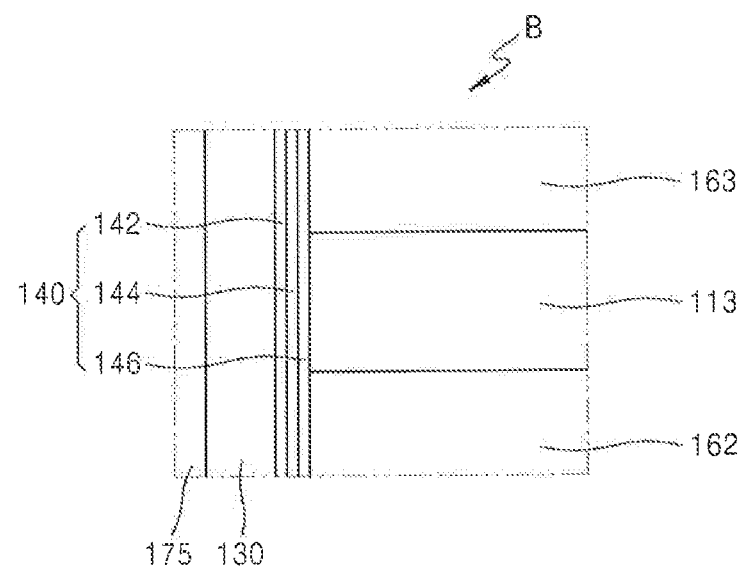

FIGS. 4A and 4B are expanded cross-sectional views of portions A and B of FIG. 3C.

In FIG. 4A, the channel region 130 that may be used as a channel of the memory cell strings is expansively illustrated. The buried insulating layer 175 may be disposed on a left side surface of the channel region 130. The gate dielectric layer 140 may be disposed on a right side surface of the channel region 130.

The gate dielectric layer 140 may have a structure in which a tunneling insulating layer 142, a charge storage layer 144, and a blocking insulating layer 146 are stacked sequentially from the right side surface of the channel region 130.

The tunneling insulating layer 142 may be a single layer or a composite layer including one or more of silicon oxide ($SiO_2$), silicon nitride ($Si_3N_4$), silicon oxynitride (SiON), a hafnium oxide (HfO$_2$), hafnium silicon oxide (HfSi$_x$O$_y$), aluminum oxide (Al$_2$O$_3$), and zirconium oxide (ZrO$_2$).

The charge storage layer 144 may be a charge trap layer. When the charge storage layer 144 is a charge trap layer, it may include one or more of SiO$_2$, Si$_3$N$_4$, SiON, HfO$_2$, ZrO$_2$, tantalum oxide (Ta$_2$O$_3$), titanium oxide (TiO$_2$), a hafnium aluminum oxide (HfAl$_x$O$_y$), hafnium tantalum oxide (HfTa$_x$O$_y$), HfSi$_x$O$_y$, aluminum nitride (Al$_x$N$_y$), and aluminum gallium nitride (AlGa$_x$N$_y$).

The blocking insulating layer 146 may include one or more of SiO$_2$, Si$_3$N$_4$, SiON, and a high-dielectric (high-k) material. The blocking insulating layer 146 may include a higher-dielectric (higher-k) material than the tunneling insulating layer 142, and the higher-k layer may include at least one of Al$_2$O$_3$, Ta$_2$O$_3$, TiO$_2$, a yttrium oxide (Y$_2$O$_3$), ZrO$_2$, zirconium silicon oxide (ZrSi$_x$O$_y$), HfO$_2$, HfSi$_x$O$_y$, lanthanum oxide (La$_2$O$_3$), lanthanum aluminum oxide (LaAl$_x$O$_y$), lanthanum hafnium oxide (LaHf$_x$O$_y$), HfAl$_x$O$_y$, and praseodymium oxide (Pr$_2$O$_3$).

The gate electrode 152 may be disposed on a right side surface of the gate dielectric layer 140. Top and bottom surfaces of the gate electrode 152 and a side surface of the gate electrode 152 facing the side of the gate dielectric layer 140 may be surrounded by the upper insulating layer 145 and a barrier metal 152-1. The upper insulating layer 145 may function as the gate dielectric layer 140. For example, the upper insulating layer 145 may be formed of an aluminum oxide layer, for example, an alumina layer. The barrier metal 152-1 may include any one of WN, TaN, and TiN. The gate electrode 152 may include tungsten.

Interlayer insulating layers 162 and 163 may be disposed on and under the gate electrode 152. The interlayer insulating layers 162 and 163 may be formed of silicon oxide.

Referring to FIG. 4B, like the structure of FIG. 4A, the outermost vertical channel structure LS may include a buried insulating layer 175, a channel region 130, and a gate dielectric layer 140. However, unlike the structure of FIG. 4A, a gate electrode is not present, and a sacrificial layer 113 may be present on a side surface of the vertical channel structure LS.

The sacrificial layer 113 may be an oxide layer or a nitride layer. The sacrificial layer 113 may be a polysilicon layer. The sacrificial layer 113 will be described later in detail with reference to FIGS. 10A to 10K. Interlayer insulating layers 162 and 163 may be disposed on and under the sacrificial layer 113.

Figure 5:
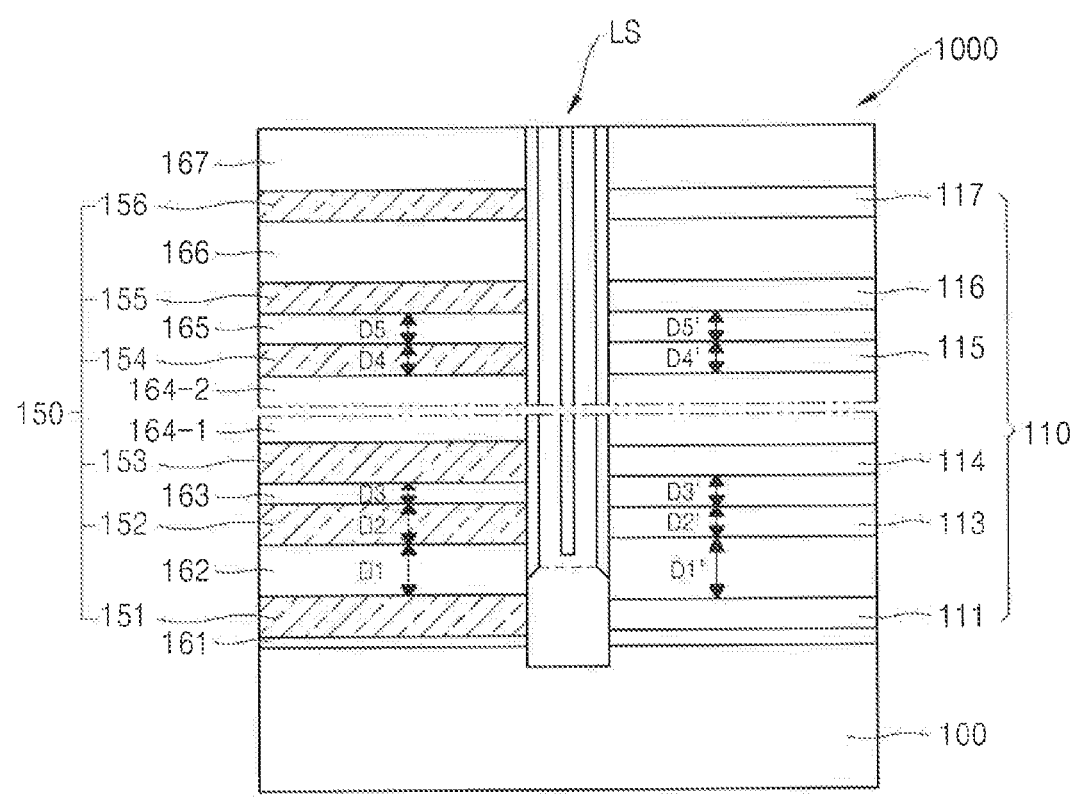
FIGS. 5 and 6 are cross-sectional views of dummy regions of cell regions of nonvolatile memory devices, according to exemplary embodiments of the inventive concept.
Figure 6:
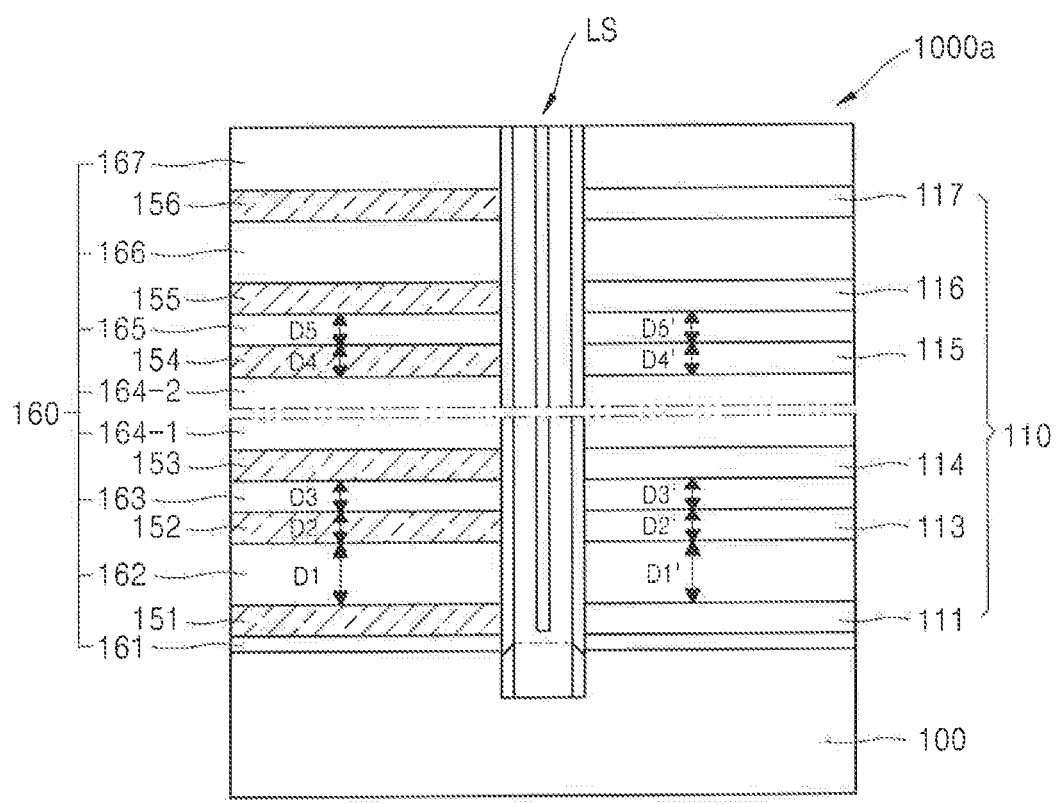

FIGS. 5 and 6 are cross-sectional views of dummy regions of cell regions of nonvolatile memory devices, according to exemplary embodiments of the inventive concept. A sacrificial layer 110 may be adjacent to the right of a vertical structure LS, and a gate electrode 150 may be adjacent to the left of the vertical structure LS.

Referring to FIG. 5, a nonvolatile memory device 1000 according to an exemplary embodiment may include a gate electrode 150 that is formed at the left side surface of the outermost vertical channel structure LS. The lower sacrificial layers 111, 113 and 114 may be formed at the right side surface of the outermost vertical channel structure LS and may be formed of a nitride layer or an oxide layer. The upper sacrificial layers 115, 116, and 117 may be formed of a polysilicon layer.

As illustrated in FIG. 5, a thickness D2 of the lower gate electrode 152 may be greater than a thickness D2' of the lower sacrificial layer 113. Thicknesses D1 and D3 of the interlayer insulating layers 162 and 163 between the lower gate electrodes 151, 152, and 153 may be smaller than thicknesses D1' and D3' of the interlayer insulating layers 162 and 163 between the lower sacrificial layers 111, 113, and 114.

A thickness D4 of the upper gate electrode 154 may be substantially equal to a thickness D4' of the upper sacrificial layer 115. A thickness D5 of the interlayer insulating layer 165 between the upper gate electrodes 154 and 155 may be substantially equal to a thickness D5' of the interlayer insulating layer 165 between the upper sacrificial layers 115 and 116.

This thickness difference may be caused by a difference in the amount of the interlayer insulating layers 160 etched in the metal replacement process, because the material of the upper sacrificial layers 115, 116, and 117 has high etch selectivity with respect to the interlayer insulating layers 160, and the material of the lower sacrificial layers 111, 113, and 114 has less etch selectivity with respect to the interlayer insulating layers 160 compared with the upper sacrificial layers 115, 116 and 117.

For example, in a metal replacement process that will be described later, the interlayer insulating layers 161, 162, 163, and 164-1 between the lower sacrificial layers 111, 113, and 114 may be etched and thinned, and the interlayer insulating layers 164-2, 165, 166, and 167 between the upper sacrificial layers 115, 116, and 117 may be less etched to the extent that the interlayer insulating layers 164-2, 165, 166, and 167 keep their original thicknesses. This will be described later in more detail with reference to FIGS. 10A to 10K.

Referring to FIG. 6, a nonvolatile memory device 1000a according to an exemplary embodiment may include a gate electrode 150 that is formed at the left side surface of the outermost vertical channel structure LS. A sacrificial layer 110 may be formed at the right side surface of the outermost vertical channel structure LS. Also, all the sacrificial layers 110 may be formed of a polysilicon layer.

Unlike the structure of the nonvolatile memory device 1000 of FIG. 5, a thickness D2 of the lower gate electrode 152 may be substantially equal to a thickness D2' of the lower sacrificial layer 113. Thicknesses D1 and D3 of the interlayer insulating layers 162 and 163 between the lower gate electrodes 151, 152, and 153 may be substantially equal to thicknesses D1' and D3' of the interlayer insulating layers 162 and 163 between the lower sacrificial layers 111, 113, and 114.

As described above, this is because the interlayer insulating layer 160 may be little etched in the metal replacement process and maintain an original thickness, because the sacrificial layer 110 is formed of a polysilicon layer that has high etch selectivity with respect to the interlayer insulating layer 160.

Figure 7:
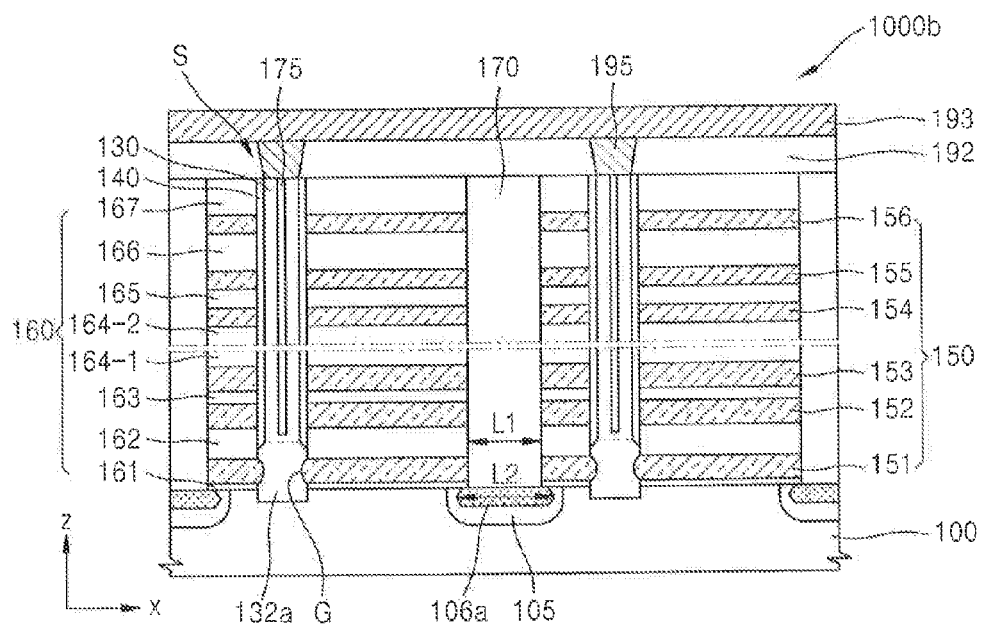
FIGS. 7 and 8 are cross-sectional views of device regions of cell regions of nonvolatile memory devices, according to exemplary embodiments of the inventive concept.
Figure 8:
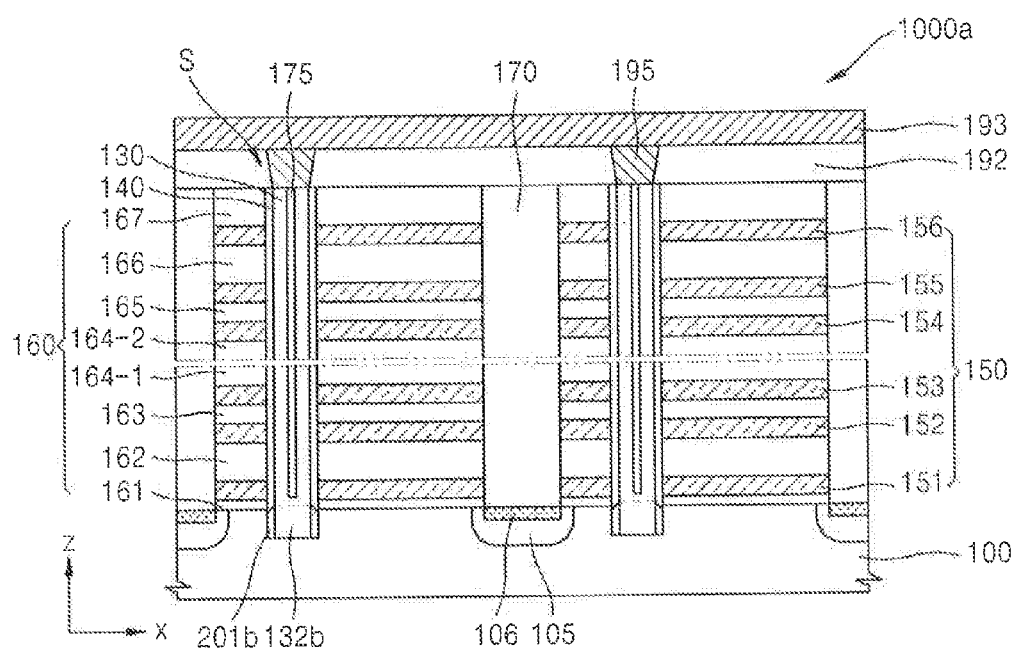

FIGS. 7 and 8 are cross-sectional views of device regions of cell regions of nonvolatile memory devices, according to exemplary embodiments of the inventive concept. For the convenience of description, the description that was made with reference to FIG. 2 will be omitted or briefly described.

Referring to FIG. 7, a nonvolatile memory device 1000b according to an exemplary embodiment may be different from the nonvolatile memory device 1000 of FIG. 2 in terms of the structure of an SEG layer 132a and the structure of a common source line 106a. The other portions may be substantially similar to those of the nonvolatile memory device 1000 of FIG. 2.

For example, the nonvolatile memory device 1000b of the present exemplary embodiment may include a groove G that is formed at a side surface of the SEG layer 132a. The common source line 106a may be formed larger than the common source line 106 of the nonvolatile memory device 1000 of FIG. 2. For example, a width L2 of the common source line 106a may be greater than a width L1 of the isolation insulating layer 170.

Such structural features of the SEG layer 132a and the common source line 106a may be formed because the SEG layer 132a and the substrate 100 are formed of silicon or polysilicon. For example, if sacrificial layers interposed between interlayer insulating layers 160 are formed of polysilicon, the SEG layer 132a and the semiconductor portion to be formed as the common source line 106a may be etched in a metal replacement process that will be described later. This will be described later in more detail with reference to FIGS. 10A to 10K.

FIG. 8 is a cross-sectional view of a device region of the nonvolatile memory device 1000a illustrated in FIG. 6. In FIG. 8, the reference numeral "201b" denotes a spacer portion that is left after a spacer removing process. Accordingly, the nonvolatile memory device 1000a of the present exemplary embodiment may be different from the nonvolatile memory device 1000 of FIG. 2 in terms of the lower gate electrodes 151, 152, and 153, corresponding interlayer insulating layers 161, 162, 163, and 164-1, and a lower portion of the vertical channel structure S.

For example, as described with reference to FIG. 6, the thicknesses of the lower gate electrodes 151, 152, and 153 may be substantially equal to the thicknesses of the upper gate electrodes 154, 155, and 156. Also, the thicknesses of the lower gate electrodes 151, 152, and 153 may be substantially equal to the thicknesses of sacrificial layers that are maintained at the right side of the outermost vertical structure LS. The thicknesses of the interlayer insulating layers 161, 162, 163, and 164-1 between the lower gate electrodes 151, 152, and 153 may be substantially equal to the thicknesses thereof before the metal replacement process.

At the lower portion of the vertical channel structure S, an SEG layer 132b may be formed lower than the gate electrode 151 of the ground selection transistor GST. Also, the gate dielectric layer 140 may extend downward to cover the gate electrode 151 of the ground selection transistor GST.

The structure of the nonvolatile memory device 1000a of the present exemplary embodiment may be caused when all the sacrificial layers 110 are formed of a polysilicon layer in a manufacturing process. A process of forming the structure of the nonvolatile memory device 1000a will be described later in more detail with reference to FIGS. 11A to 11F.

FIGS. 9A to 9D are expanded cross-sectional views of a portion D of FIG. 2, according to exemplary embodiments of the inventive concept.

Figure 9A:
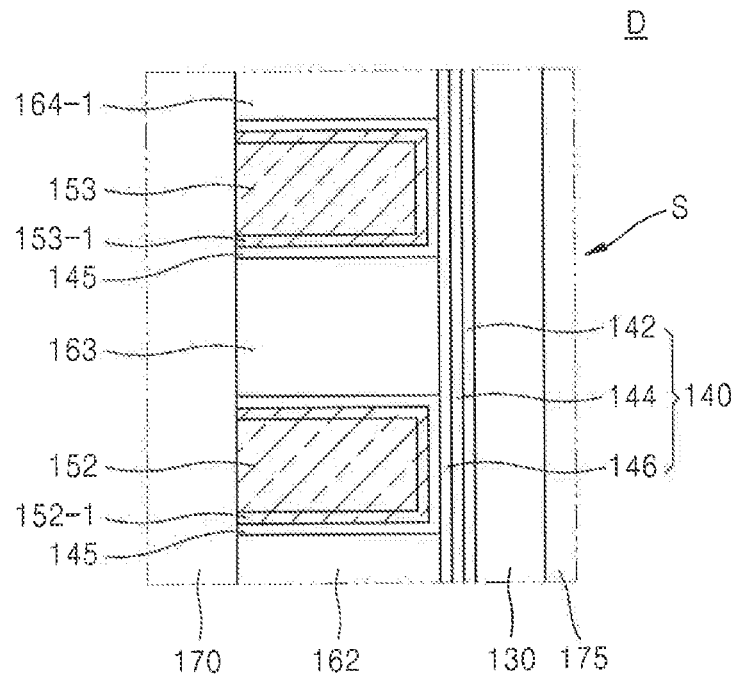
FIGS. 9A to 9D are expanded cross-sectional views of a portion D of FIG. 2, according to exemplary embodiments of the inventive concept.

Referring to FIG. 9A, as described with reference to FIG. 4A, the vertical channel structure S may include a gate dielectric layer 140, a channel region 130, and a buried insulating layer 175. The gate electrodes 152 and 153 may be formed on the blocking insulating layer 146 of the gate dielectric layer 140.

Top and bottom surfaces of the gate electrodes 152 and 153 and side surfaces of the gate electrodes 152 and 153 facing the side of the gate dielectric layer 140 may be surrounded by the upper insulating layer 145 and barrier metals 152-1 and 153-1. The isolation insulating layer 170 may be formed on side surfaces of the gate electrodes 152 and 153 at the opposite side of the gate dielectric layer 140.

Interlayer insulating layers 162, 163, and 164-1 may be disposed on and under the gate electrodes 152 and 153. Right side surfaces of the interlayer insulating layers 162, 163, and 164-1 may contact the gate dielectric layer 140 of the vertical channel structure S, and left side surfaces of the interlayer insulating layers 162, 163, and 164-1 may contact the isolation insulating layer 170. The upper insulating layer 145 may be disposed at the right side surfaces of the interlayer insulating layers 162, 163, and 164-1.

Figure 9B:
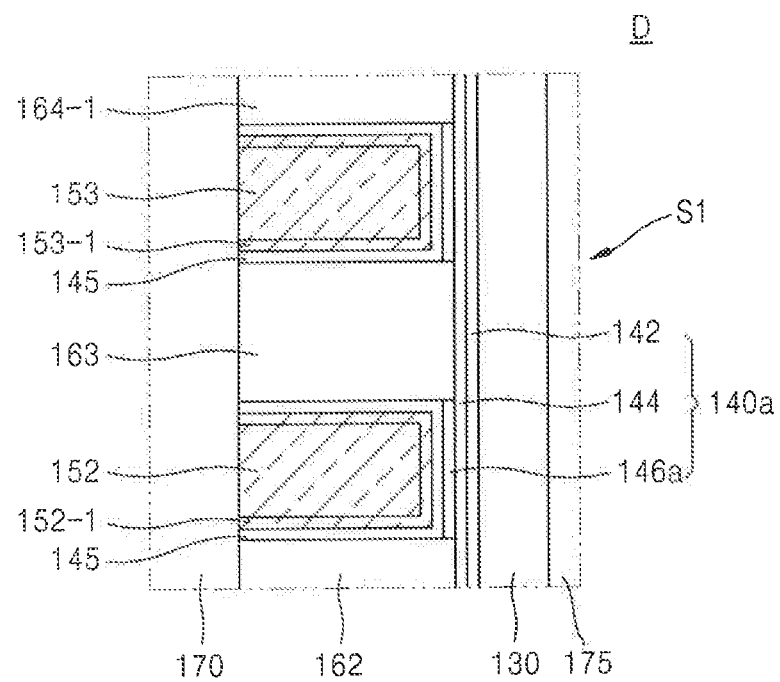

Referring to FIG. 9B, a vertical channel structure S1 may be different from the vertical channel structure S of FIG. 9A in terms of the structure of a gate dielectric layer 140a. For example, a blocking insulating layer 146a may be formed of a silicon oxide layer. The silicon oxide layer may be formed by partially oxidizing a polysilicon layer used as a sacrificial layer.

The silicon oxide layer may be formed by exposing a first opening Ta (see FIG. 10B) through a polysilicon layer of the sacrificial layers 110 and oxidizing the exposed polysilicon layer, when forming the first opening Ta to form the vertical channel structure S1.

As illustrated in FIG. 9A, the upper insulating layer 145, the barrier metals 152-1 and 153-1, and the gate electrodes 152 and 153 may be disposed on the silicon oxide layer.

Figure 9C:
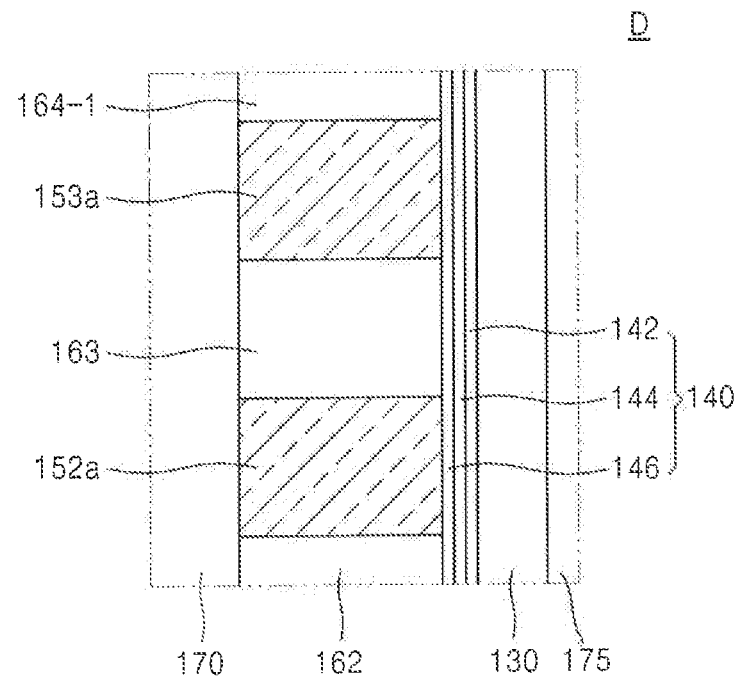

Referring to FIG. 9C, gate electrodes 152a and 153a may be different from the gate electrodes 152 and 153 of FIG. 9A in that the gate electrodes 152a and 153a are formed of metal silicide. For example, the gate electrodes 152a and 153a may be formed by leaving a portion of a polysilicon sacrificial layer without removing all the polysilicon sacrificial layer in the metal replacement process, forming a metal layer on the left polysilicon sacrificial layer, and forming metal silicide by a silicidation process.

Figure 9D:
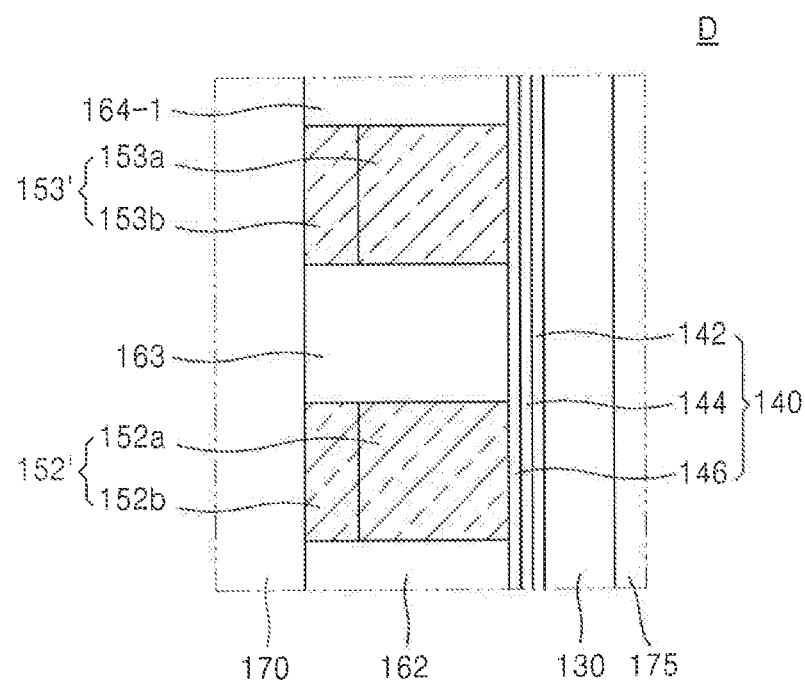

Referring to FIG. 9D, gate electrodes 152' and 153' may be different from the gate electrodes 152 and 153 of FIG. 9A in that the gate electrodes 152' and 153' include metal silicide layers 152a and 153a and metal layers 152b and 153b. For example, the gate electrodes 152' and 153' may be formed by leaving a portion of a polysilicon sacrificial layer without removing all the polysilicon sacrificial layer in the metal replacement process, forming a metal layer on the left polysilicon sacrificial layer, forming metal silicide layers 152a and 153a by silicifying a portion or all of the metal layer and the polysilicon layer, and forming metal layers 152b and 153b by the metal left on a top thereof or the additionally-formed metal.

FIGS. 10A to 10K are cross-sectional views illustrating a method of manufacturing the vertical-type nonvolatile memory device 1000 of FIG. 2, according to an exemplary embodiment of the inventive concept.

Figure 10A:
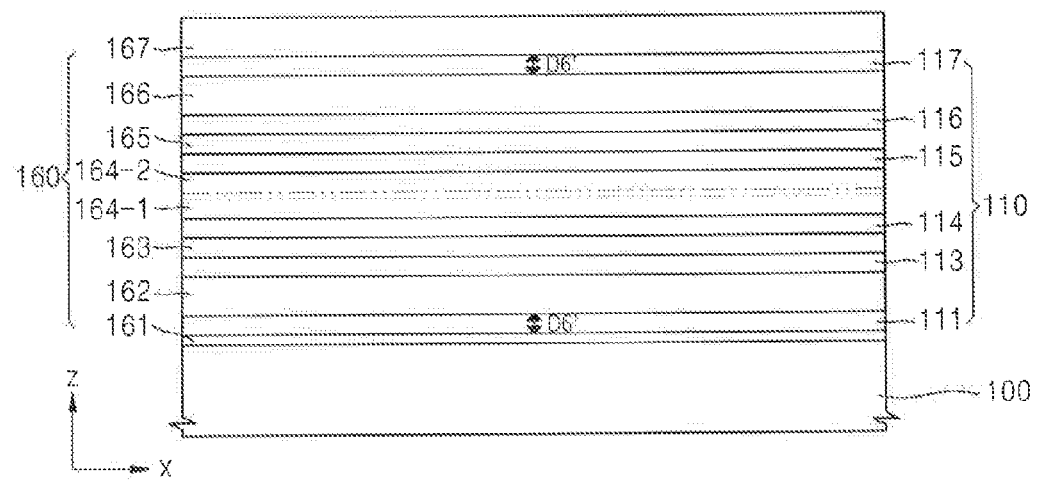
FIGS. 10A to 10K are cross-sectional views illustrating a method of manufacturing the vertical-type nonvolatile memory device of FIG. 2, according to an exemplary embodiment of the inventive concept.

Referring to FIG. 10A, interlayer insulating layers 160 (161 to 167) and sacrificial layers 110 (111 and 113 to 117) are alternately stacked on a substrate 100. As illustrated in FIG. 10A, the interlayer insulating layers 160 and the sacrificial layers 110 may be stacked on the substrate 100 alternately from the first interlayer insulating layer 161.

The first sacrificial layers 111, 113, and 114 among the sacrificial layers 110 may be formed of an oxide material or a nitride material that has etch selectivity with respect to the interlayer insulating layers 160. For example, the first sacrificial layers 111, 113, and 114 may be formed of oxide or nitride that has a higher etch rate than the interlayer insulating layers 160 with respect to a predetermined etchant. Accordingly, the etching of the interlayer insulating layers 160 may be minimized in the etching of the first sacrificial layers 111, 113, and 114. The etch selectivity may be quantitatively expressed by the ratio of an etch rate of the first sacrificial layers 111, 113, and 114 to an etch rate of the interlayer insulating layers 160. For example, the interlayer insulating layers 160 may include at least one of a silicon oxide layer and a silicon nitride layer, and the first sacrificial layers 111, 113, and 114 may include a material that has high etch selectivity with respect to the interlayer insulating layers 160. For example, the material of the first sacrificial layers 111, 113 and 114 may include silicon oxide, silicon carbide or silicon nitride.

The second sacrificial layers 115, 116, and 117 may be formed of a material that has high etch selectivity with respect to the interlayer insulating layers 160 and has low etch selectivity with respect to the first sacrificial layers 111, 113, and 114. For example, the second sacrificial layers 115, 116, and 117 may be formed of a material that has lower etch selectivity than the first sacrificial layers 111, 113, and 114 with respect to a first etchant and has higher etch selectivity than the interlayer insulating layers 160 with respect to a second etchant. In detail, the etching of the second sacrificial layers 115, 116, and 17 and the interlayer insulating layers 160 may be minimized when the first etchant is used to etch the first sacrificial layers 111, 113, and 114; and the etching of the interlayer insulating layers 160 may be minimized when the second etchant is used to etch the second sacrificial layers 115, 116, and 117.

The second etchant may include a halogen-containing reaction gas. For example, the second etchant may include at least one of $Cl_2$, $NF_3$, $ClF_3$, and $F_2$ reaction gases. Also, the second etchant may include a carrier gas such as $N_2$. The second sacrificial layers 115, 116, and 17 may be formed of a polysilicon layer, and a $Cl_2$ reaction gas may be used as the second etchant. Also, the polysilicon layer may be formed of at least one of undoped polysilicon, P-type polysilicon, N-type polysilicon, and carbon-doped (C-doped) polysilicon.

As illustrated in FIG. 10A, the thicknesses of the interlayer insulating layers 160 not be equal to each other. For example, the lowermost first interlayer insulating layer 161 among the interlayer insulating layers 160 may have smaller thickness compared with the second interlayer insulating layers 162 to 167. The first interlayer insulating layer 161 may be formed of the same material as the second interlayer insulating layers 162 to 167. Alternatively, the first interlayer insulating layer 161 may be formed of a different material than the second interlayer insulating layers 162 to 167. Even when the first interlayer insulating layer 161 is formed of a different material than the second interlayer insulating layers 162 to 167, the etch selectivity of the sacrificial layers 110 may be the same as described above. For example, the first interlayer insulating layer 161 may be formed of a middle temperature oxide (MTO) layer as a buffer layer, and may function to insulate the gate electrode 151 (see FIG. 2) of the ground selection transistor GST from the substrate 100.

The interlayer insulating layers 160 and the sacrificial layers 110 may formed in various thickness. For example, the lowermost interlayer insulating layer 162 and the two uppermost interlayer insulating layers 166 and 167 among the second interlayer insulating layers 162 to 167 may be formed to be relatively thick, and the interlayer insulating layers 163, 164-1, 164-2, and 165 therebetween may be formed to be relatively thin and uniform. The interlayer insulating layers 160 and the sacrificial layers 110 may be formed of at least two layers.

Figure 10B:
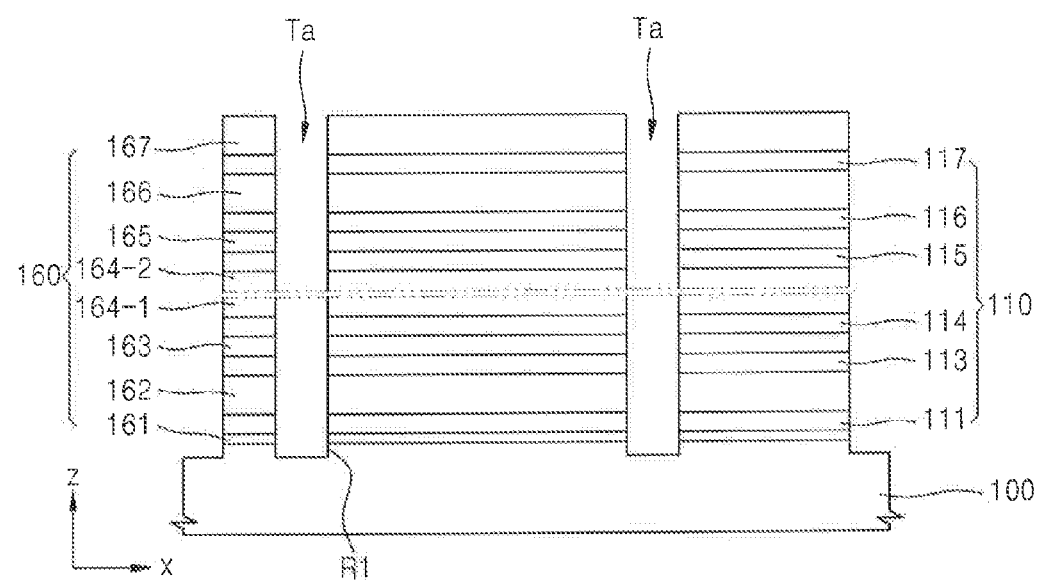
Figure 10C:
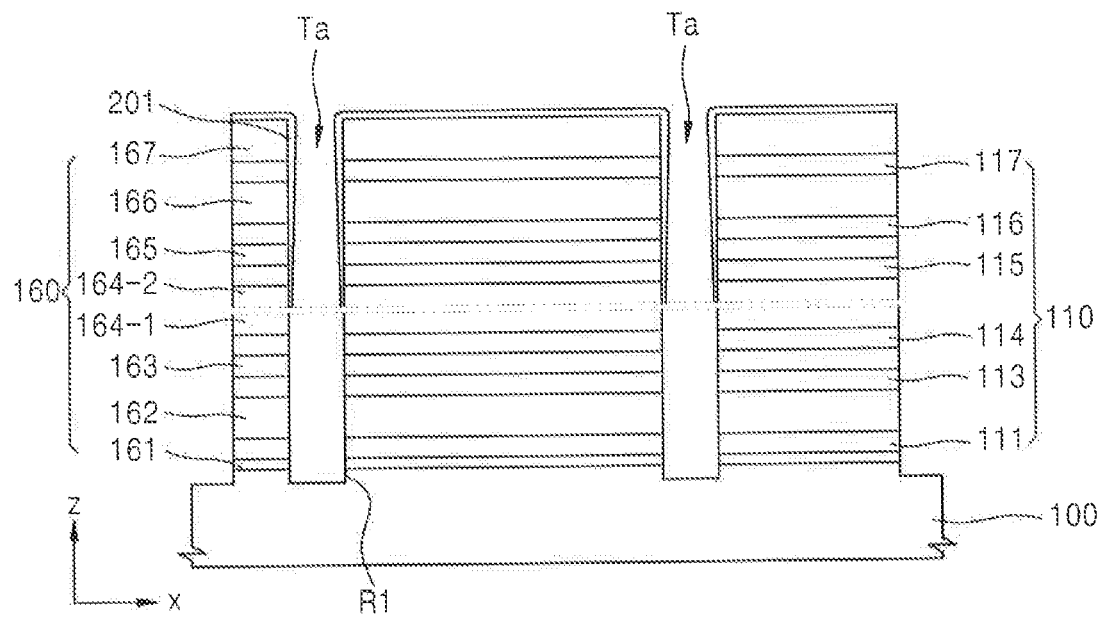
Figure 10D:
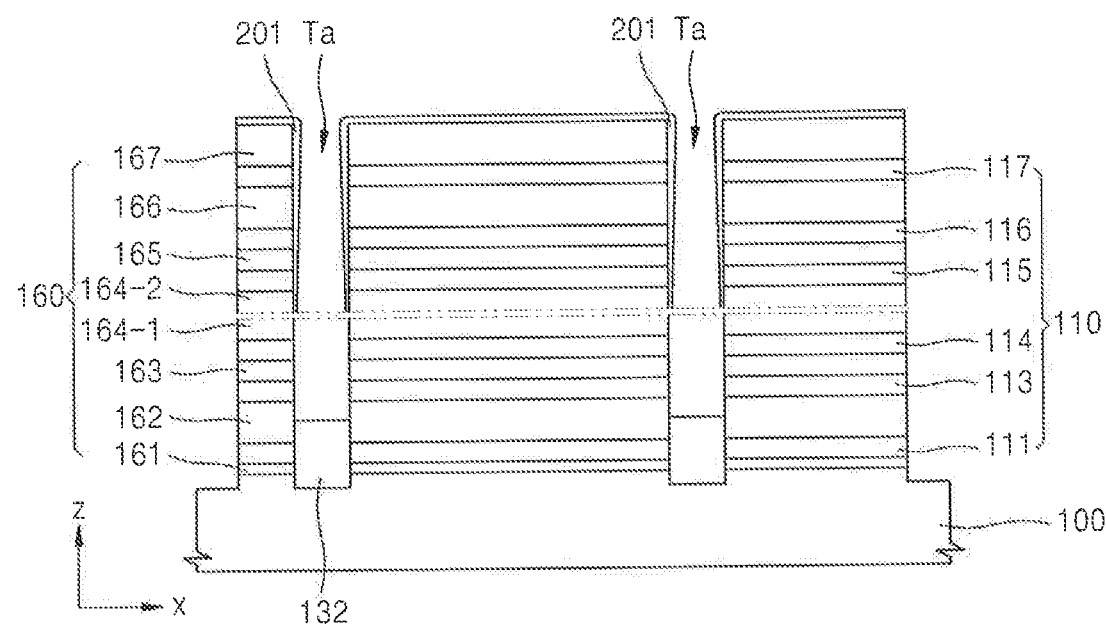
Figure 10E:
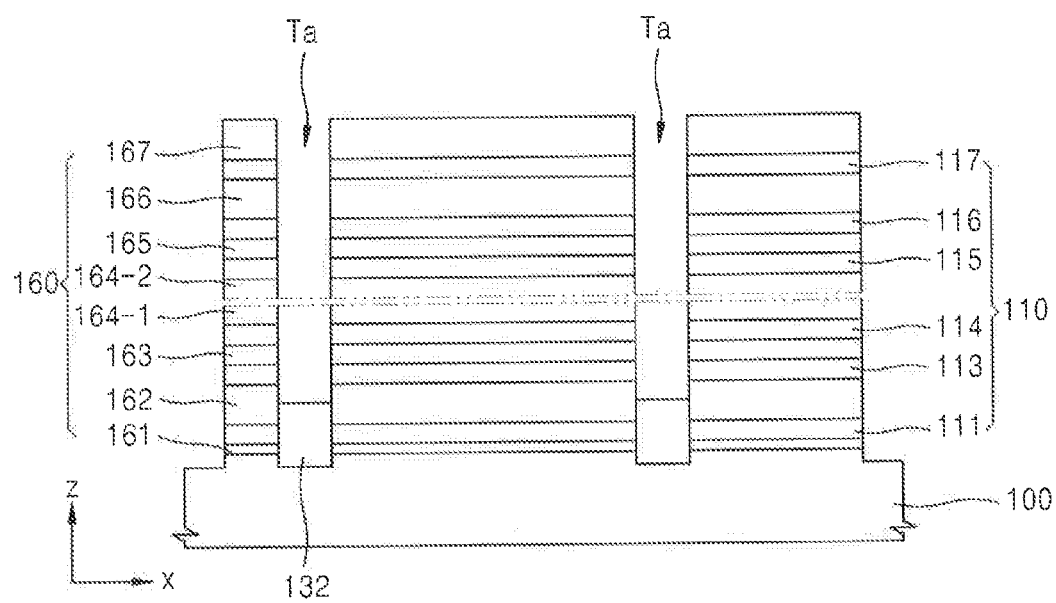
Figure 10F:
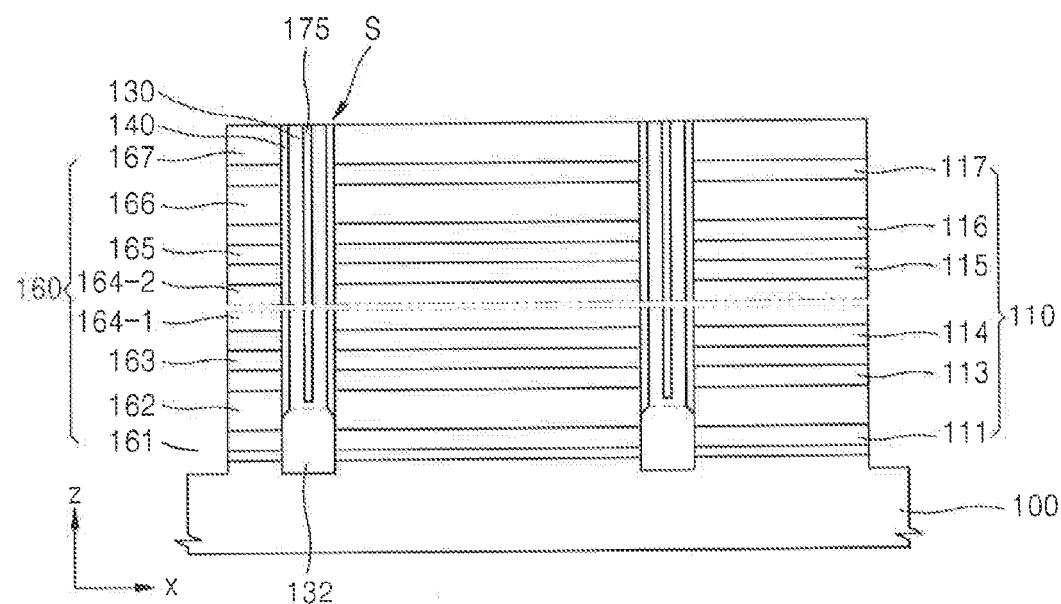
Figure 10G:
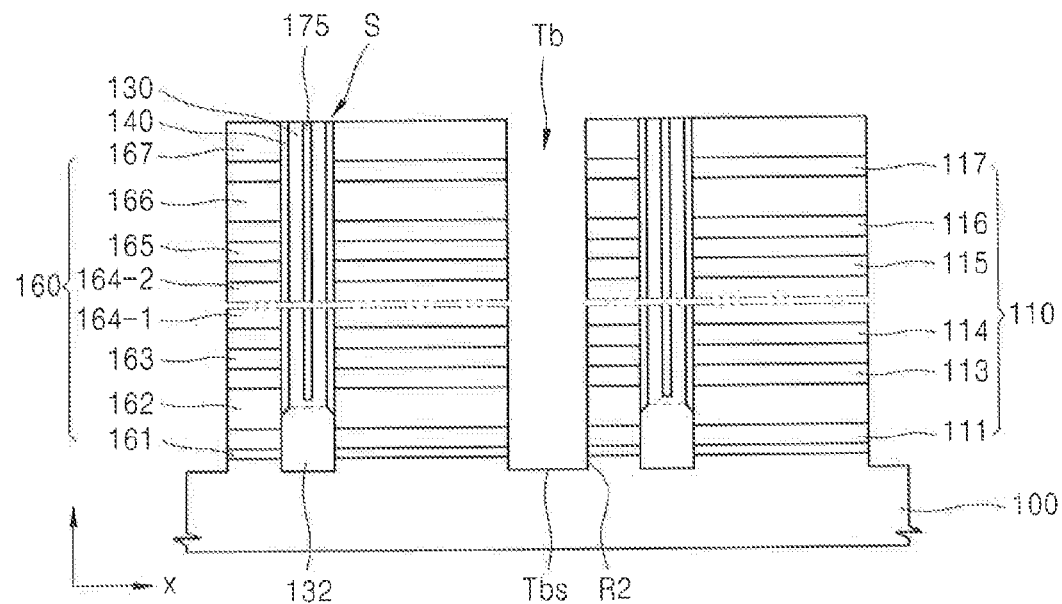
Figure 10H:
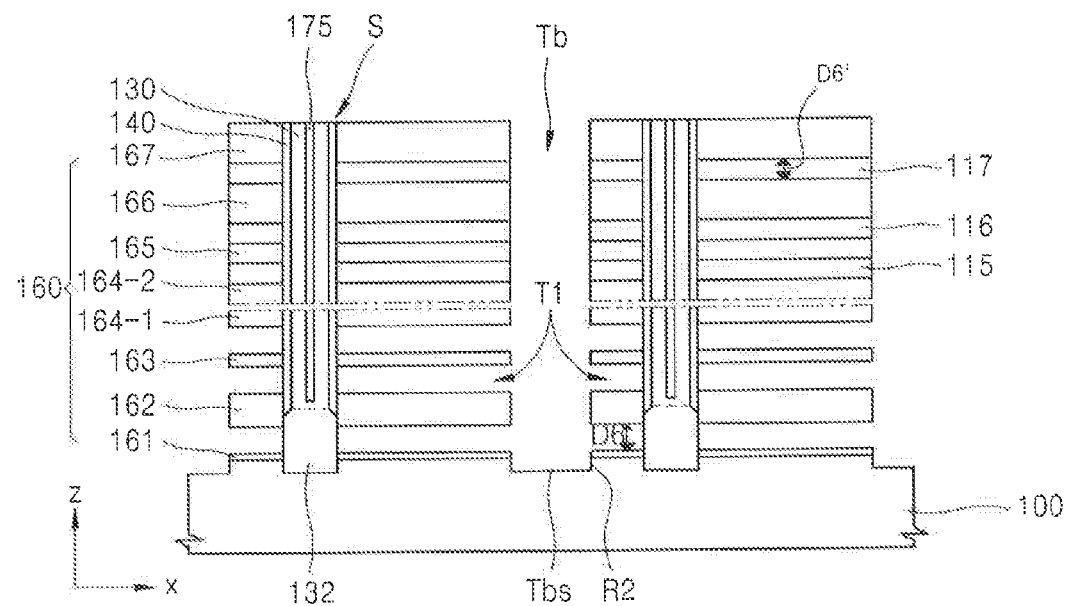
Figure 10I:
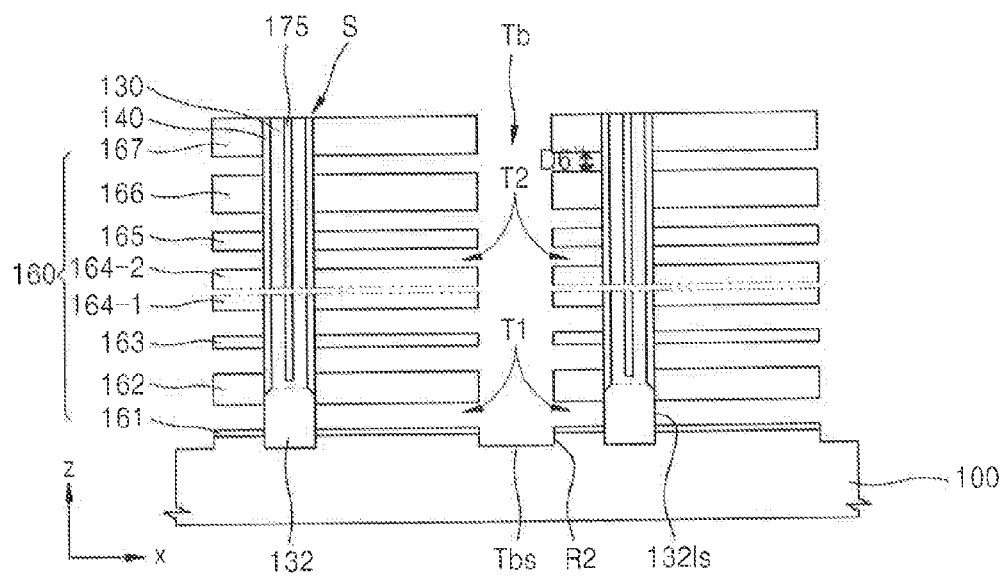
Figure 10J:
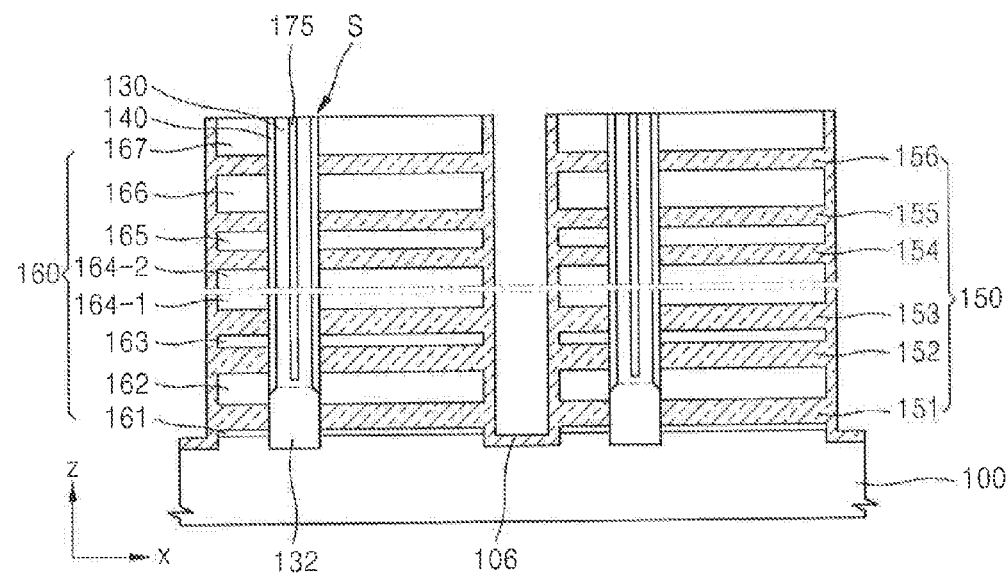

As may be seen from FIG. 10J, after a metal replacement process is performed, the thicknesses of lower gate electrodes 151, 152 and 153 corresponding to the first sacrificial layers 111, 113, and 114 are greater than the thicknesses of upper gate electrodes 154, 155 and 156 corresponding to the second sacrificial layers 115, 116, and 117. This is because a portion of the adjacent interlayer insulating layers 160 is etched during the etching of the first sacrificial layers 111, 113, and 114. Thus, when the same gate electrode thickness is to be maintained after the metal replacement process, the second sacrificial layers 115, 116, and 117 may be formed thicker than the first sacrificial layers 111, 113, and 114, in consideration of the etching of the interlayer insulating layers. For example, the first sacrificial layers 111, 113, and 114 may be thin, and the interlayer insulating layers 162, 163, and 164-1 adjacent to the first sacrificial layers 111, 113, and 114 may be formed thicker than the interlayer insulating layers 164-2, 165, 166, and 167 adjacent to the second sacrificial layers 115, 116, and 117.

Referring to FIG. 10B, the interlayer insulating layers 160 and the sacrificial layers 110 stacked alternately with each other are etched to form first openings Ta exposing a portion of the substrate 100.

The first openings Ta may be formed by forming a predetermined mask pattern defining the position of the first openings Ta on the interlayer insulating layers 160 and the sacrificial layers 110 that are stacked alternately with each other, and anisotropically etching the interlayer insulating layers 160 and the sacrificial layers 110 by using an etchant that may etch the interlayer insulating layers 160 and the sacrificial layers 110 by using the mask pattern as an etch mask for the etching process.

In the etching process, a recess R1 may be formed at a top surface of the substrate 100 in the forming of the first openings Ta. Alternatively, the etching process may be controlled so that only the top surface of the substrate 100 may be exposed without form the recess R1.

The first openings Ta may be formed in the shape of a circular hole that has a predetermined depth in the z direction. However, the shape of the first openings Ta is not limited thereto, and the shape of the first openings Ta may vary according to the structure of a channel region that is to be formed. Also, the first openings Ta may be spaced apart and isolated from each other in the x direction and the y direction (see FIG. 2).

Referring to FIG. 10C, a spacer 201 is formed in the first openings Ta to cover the second sacrificial layers 115, 116, and 117. The spacer 201 may be formed of an oxide layer or a nitride layer. The spacer 201 may be formed on an upper surface of the uppermost interlayer insulating layer 167. The spacer 201 may also be formed on side surfaces of the interlayer insulating layers 164-2, 165, 166, and 167. The spacer 201 may also be formed on the side surfaces of the second sacrificial layer 115, 116 and 117. therebetween. According to some exemplary embodiments, if only the top surface of the substrate 100 is exposed, the spacer 201 may cover the side surfaces of a portion or all of the first sacrificial layers 111, 113, and 114 and the side surfaces of the interlayer insulating layers 161, 162, 163, and 164-1 therebetween.

The spacer 201 may be formed through a deposition process with a poor step coverage. For example, the spacer 201 may be formed through a physical vapor deposition (PVD) process with a poor step coverage. The spacer 201 may also be formed through a cyclic chemical vapor deposition (CVD) process with a poor step coverage. The cyclic CVD process is a process of depositing a thin film by a combination of an atomic layer deposition (ALD) process and a CVD process. Like the ALD process, the cyclic CVD process periodically supplies and discharges reaction materials. However, without completely discharging the reaction materials, the cyclic CVD process generates a chemical reaction between the reaction materials, increases a deposition rate, and controls a step coverage.

In this manner, by using a deposition process with a poor step coverage, the spacer 201 may be formed only on the second sacrificial layers 115, 116, and 117 and the side surfaces of the interlayer insulating layers 164-2, 165, 166, and 167. An etching process may be performed to remove a spacer material layer that may be formed on the bottom surface of the first openings Ta.

Alternatively, the spacer 201 may be formed by conformally forming a spacer material layer on the bottom surfaces and the side surfaces of the first openings Ta, and the top surface of the uppermost interlayer insulating layer 167, and then removing the material layer on the top surface of the interlayer insulating layer 167 and the bottom surfaces of the first openings Ta.

Referring to FIG. 10D, an SEG layer 132 is formed on the substrate 100 through the first openings Ta by a selective epitaxial growth process. As illustrated in FIG. 10D, a top surface of the SEG layer 132 may be higher than a top surface of the lowermost sacrificial layer 111. However, the height of the SEG layer 132 is not limited thereto. For example, the top surface of the SEG layer 132 may be lower than the top surface of the lowermost sacrificial layer 111, due to the material of the lowermost sacrificial layer or the structure of a gate dielectric layer 140 that is to be formed later. The spacer 201 may prevent an epitaxial layer from forming on the side surface of the second sacrificial layer 115, 116 and 117.

Referring to FIG. 10E, the spacer 201 is removed after the forming of the SEG layer 132. By removing the spacer 201, the second sacrificial layers 115, 116, and 117 and the interlayer insulating layers 164-2, 165, 166, and 167 may be exposed again through the first openings Ta.

Referring to FIG. 10F, a dielectric layer (not illustrated) is formed to uniformly cover the inner walls and the bottom surfaces of the first openings Ta and the top surface of the uppermost interlayer insulating layer 167. As described above with reference to FIG. 2 or 4A, the dielectric layer may include a blocking insulating layer, a charge storage layer, and a tunneling insulating layer. Thus, the blocking insulating layer, the charge storage layer, and the tunneling insulating layer may be sequentially stacked in the first openings Ta. The blocking insulating layer, the charge storage layer, and the tunneling insulating layer may be formed using an ALD process, a CVD process, or a PVD process.

Thereafter, an etching process, the dielectric layer on the bottom surfaces of the first openings Ta and the top surface of the uppermost interlayer insulating layer 167 is removed so that the dielectric layer is left only on the inner walls of the first openings Ta to form a gate dielectric layer 140. By removing the dielectric layer on the bottom surfaces of the first openings Ta using the etching process, the top surface of the SEG layer 132 may be exposed again through the first openings Ta.

A channel layer (not illustrated) is formed on the SEG layer 132, the gate dielectric layer 140, and the uppermost interlayer insulating layer 167. The channel layer may be formed of a semiconductor material such as polysilicon or monocrystalline silicon. The semiconductor material may include an undoped material, a P-type dopant, or an N-type dopant. The channel layer may be formed to a uniform thickness using an ALD process or a CVD process.

After the forming of the channel layer, the first openings Ta are completely filled with an insulating layer (not illustrated). Alternatively, before the forming of the insulating layer, a hydrogen annealing process may be performed on the channel layer under a gas atmosphere including hydrogen or heavy hydrogen. The hydrogen annealing process may remove crystal defects in the channel layer.

The channel layer and the insulating layer that is formed on the top surface of the uppermost interlayer insulating layer 167 may be removed by using a planarization process, for example, a chemical mechanical polishing (CMP) process and/or an etch-back process. The top surface of the uppermost interlayer insulating layer 167 may be exposed after the planarization process. Accordingly, a channel region 130 and a buried insulating layer 175 may be formed in the first openings Ta.

When the first openings Ta are completely filled with the channel layer, a separate insulating layer is not formed and thus a buried insulating layer may not be formed in the first openings Ta.

Referring to FIG. 10G, the sacrificial layers 110 and the interlayer insulating layers 160 between the first openings Ta are anisotropically etched to form second openings Tb that expose the substrate 100. The second openings Tb may be formed in the shape of a line that extends in the y direction (see FIG. 2). The second openings Tb may be formed between the vertical channel structures S. However, the inventive concept are not limited thereto, and the positions of the second openings Tb with respect to the vertical channel structures S and the number of second openings Tb may vary.

A recess R2 may be formed to a predetermined depth in the substrate 100 by over-etching the substrate 100 in the anisotropic etching. By the forming of the second openings Tb, side surfaces of the sacrificial layers 110 and the interlayer insulating layers 160 may be exposed and a top surface Tbs of the substrate 100 may be exposed. The top surface Tbs of the substrate 100 may refer to a bottom surface of the recess R2.

Referring to FIG. 10H, the first sacrificial layers 111, 113, and 114 exposed through the second openings Tb may be removed by a first etch process to form first side openings T1 that are defined between the interlayer insulating layers 160. The surfaces of the gate dielectric layer 140 may be partially exposed through the first side openings T1.

The first side openings T1 may be formed by etching the first sacrificial layers 111, 113, and 114. In the etching process, an etchant that has high etch selectivity with respect to the interlayer insulating layers 160 and the second sacrificial layers 115, 116, and 117 may be used. For example, when the first sacrificial layers 111, 113, and 114 are silicon oxide layers, the second sacrificial layers 115, 116, and 117 are polysilicon layers, and the interlayer insulating layers 160 are silicon oxide layers, the first etch process may be performed by using an etchant including phosphoric acid. The first etching process may be an isotropic etch process including wet etching or chemical dry etching (CDE) processes.

In comparison with the second sacrificial layers 115, 116, and 117, the first sacrificial layers 111, 113, and 114 may have not-so-high etch selectivity with respect to the interlayer insulating layers 160. Accordingly, a portion of the interlayer insulating layers 160 may be etched during the etching of the first sacrificial layers 111, 113, and 114. Accordingly, after the first sacrificial layers 111, 113, and 114 are removed, a distance D6 between the lowermost interlayer insulating layer 161 and the interlayer insulating layer 162 thereon may be greater than an initial thickness D6' (see FIG. 10A) of the lowermost sacrificial layer 111.

Referring to FIG. 10I, the second sacrificial layers 115, 116, and 117 exposed through the second openings Tb are removed by a second etch process to form second side openings T2. The second side openings T2 may be formed by etching the second sacrificial layers 115, 116, and 117 by using an etchant that has high etch selectivity with respect to the interlayer insulating layers 160. For example, when the second sacrificial layers 115, 116, and 117 are polysilicon layers, the substrate 100 is a silicon substrate having a <100> crystal direction, and the interlayer insulating layers 160 are silicon oxide layers, the second etch process may be performed by a gas phase etching or CDE process using an etchant including a halogen-containing reaction gas. The halogen-containing reaction gas may include $Cl_2$, NF3, $ClF_3$, or $F_2$ gases. The second etch process may be an isotropic etch process.

Also, the second etch process may be performed using a plasma-less thermal etch process. The second etch process may be performed below about 500° C. By the thermal etch process under this temperature condition, the etch selectivity of the second sacrificial layers 115, 116, and 117 with respect to the substrate 100 and the interlayer insulating layers 160 may be maximized. For the thermal etch process, $Cl_2$, $NF_3$, and $ClF_3$ reaction gases among the halogen-containing reaction gas may be used below about 500° C., and an $F_2$ reaction gas may be used below about 200° C.

In order to form a gate electrode by metal silicide, a second etch process may be performed to leave a portion of the second sacrificial layers 115, 116, and 117 without removing all of the second sacrificial layers 115. Accordingly, the etching of the substrate 100 or the SEG layer 132 may be further suppressed.

The second sacrificial layers 115, 116, and 117 may have high etch selectivity with respect to the interlayer insulating layers 160. Accordingly, the interlayer insulating layers 160 may be little etched during the etching of the second sacrificial layers 115, 116, and 117. Accordingly, after the second sacrificial layers 115, 116, and 117 are removed, a distance D6" between the uppermost interlayer insulating layer 167 and the interlayer insulating layer 166 thereunder may be substantially equal to an initial thickness D6' (see FIG. 10A) of the uppermost sacrificial layer 117.

Referring to FIG. 10J, the second openings Tb and the first and second side openings T1 and T2 are filled with a conductive material. The conductive material may be a metal, for example, tungsten. The first and second side openings T1 and T2 may be completely filled with the conductive material. For example, the conductive material may completely fill the first and second side openings T1 and T2 and cover the side surfaces of the interlayer insulating layers 160 and the top surface of the substrate 100 exposed by the second opening Tb without completely filling the second opening Tb. Alternatively, the second openings Tb may be completely filled with the conductive material.

Figure 10K:
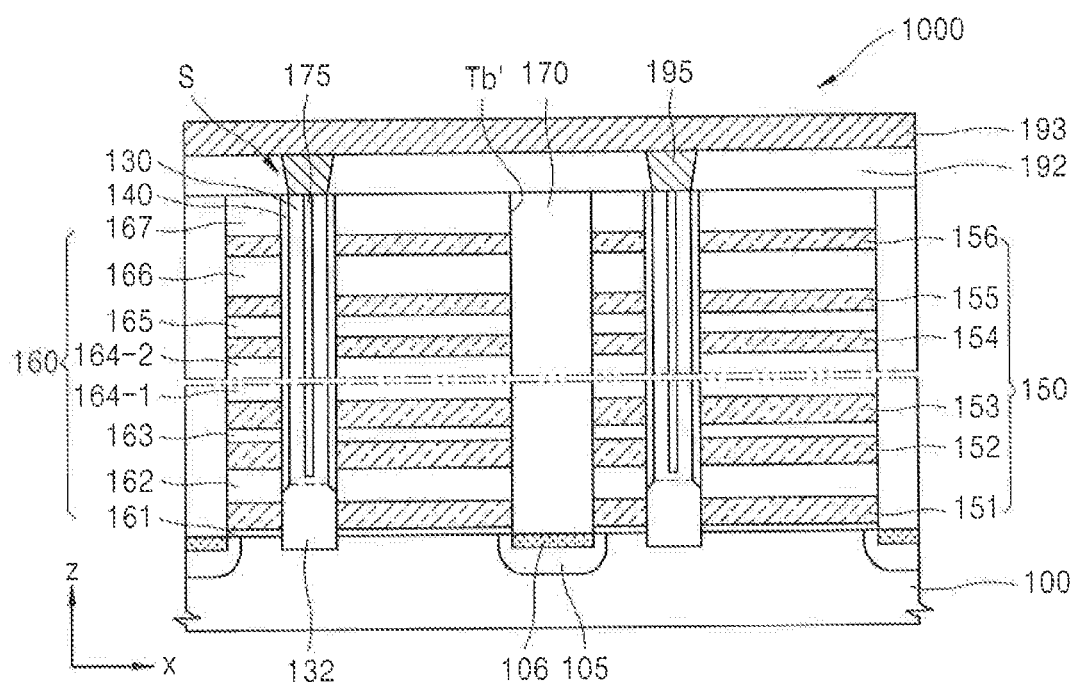

Referring to FIG. 10K, the conductive material are partially removed such that gate electrodes 150 (151 to 156) of a ground selection transistor GST, memory cells MC1, MC2, MCn−1, and MCn, and a string selection transistor SST are formed. The conductive material may be anisotropically etched to form a third opening Tb' that is substantially similar to the second opening Tb as shown in FIG. 10G. The sacrificial layers 110 of FIG. 10G are replaced with the gate electrodes 150 of FIG. 10K.

The gate electrodes 150 may be formed of a metal such as tungsten. Also, the gate electrodes 150 may be formed of a polysilicon layer, or may be formed of metal silicide or metal/metal silicide as described with reference to FIGS. 9C and 9D. When the gate electrode 150 is formed of a metal/metal silicide, the resistance of the gate electrode 150 may be reduced.

The process of FIGS. 10H to 10J is a process of replacing the sacrificial layers 110 with a metal. Accordingly, the process of FIGS. 10H to 10J may be referred to as a metal replacement process.

Thereafter, a dopant is implanted into the substrate 100 through the third openings Tb', thereby forming a doped region 105. The doped region 105 may be a source region. Subsequently, a common source line (CSL) 106 is formed on the doped region. The common source line 106 may be formed of metal silicide, for example, cobalt silicide (Co-$Si_x$). Also, the common source line 106 may include metal silicide and a metal layer that is formed on the metal silicide. The metal layer may be apart from the gate electrode 150. The metal layer may be formed of tungsten (W), aluminum (Al), or copper (Cu).

Subsequently, an isolation insulating layer 170 is formed on the common source line 106 to fill the third openings Tb'. The isolation insulating layer 170 may be formed of the same material as the interlayer insulating layers 160. The isolation insulating layer 170 may be formed through an insulating material deposition process and a planarization process.

Subsequently, a line insulating layer 192 is formed over the resulting substrate structure, and a bit line contact plugs 195 is formed in the line insulating layer 192. The bit line contact plugs 195 are in contact with the channel region 130. Thereafter, a bit line 193 connecting the bit line contact plugs 195 arranged in the x direction is formed on the line insulating layer 192.

Referring back to FIG. 10F, the line insulating layer 192 may be formed on the vertical channel structure S and the uppermost interlayer insulating layer 167 before the metal replacement process described with reference to FIGS. H to J. In this case, the process of FIG. 10G may be performed by treating the line insulating layer 192 as the interlayer insulating layers 160. After the isolation insulating layer 170 is formed, the bit line contact plug 195 may be formed in the line insulating layer 192, and the bit line 193 may be formed on the line insulating layer 192 and the isolation insulating layer 170.

FIGS. 11A to 11F are cross-sectional views illustrating a method of manufacturing the vertical-type nonvolatile memory device 1000a of FIG. 8, according to an exemplary embodiment of the inventive concept.

Figure 11A:
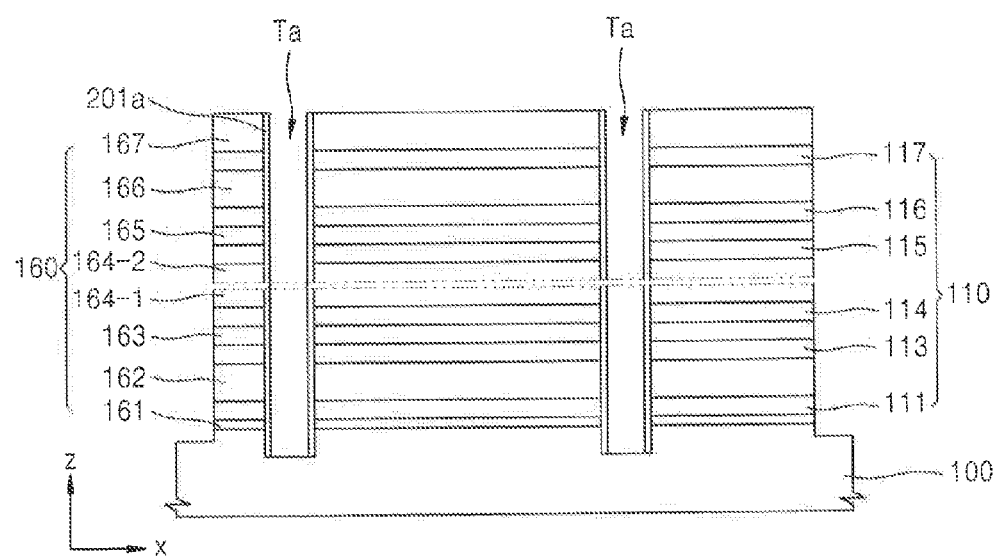
FIGS. 11A to 11F are cross-sectional views illustrating a method of manufacturing the vertical-type nonvolatile memory device of FIG. 8, according to an exemplary embodiment of the inventive concept.

Referring to FIG. 11A, interlayer insulating layers 160 and sacrificial layers 110 are alternately stacked on a substrate 100 in substantially the same manner as described with reference to FIG. 10A. However, unlike FIG. 10A, all the sacrificial layers 110 may be formed of a polysilicon layer. Thereafter, first openings Ta exposing a portion of the substrate 100 are formed by etching the interlayer insulating layers 160 and the sacrificial layers 110 as described with reference to FIG. 10B.

After the first openings Ta are formed, a spacer 201a is formed to cover sidewalls of the first openings Ta. The spacer 201a may be formed on side surfaces of all the sacrificial layers 110 and side surfaces of all the interlayer insulating layers 160. The spacer may prevent an epitaxial growth of silicon from occurring on the side surfaces of the sacrificial layers 110 in a SEG process to form an SEG layer 132b of FIG. 11B.

The spacer 201a may be formed by conformally forming a spacer material layer on the bottom and side surfaces of the first openings Ta and the top surface of the uppermost interlayer insulating layer 167, and then removing the spacer material layer formed on the top surface of the interlayer insulating layer 167 and the bottom surfaces of the first openings Ta. Like the spacer 201 of FIG. 10C, the spacer 201a may be formed of an oxide layer or a nitride layer.

Figure 11B:
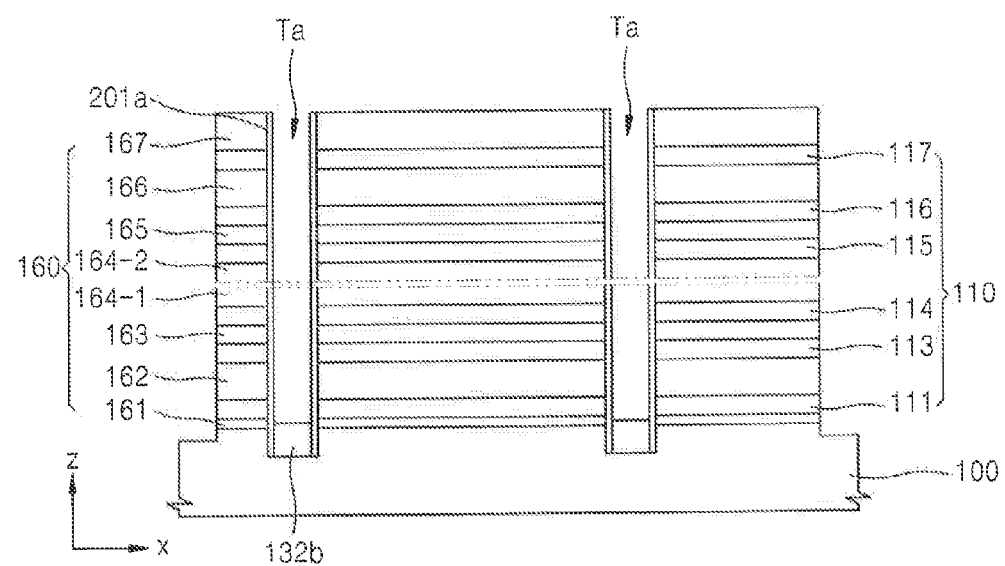

Referring to FIG. 11B, an SEG layer 132b is formed on the substrate 100 exposed through the first openings Ta by a selective epitaxial growth process. The top surface of the SEG layer 132b may be lower than the top surface of the lowermost sacrificial layer 111. Such selective epitaxial growth process, which may be referred to as a just-active SEG process, is controlled such that the top surface of the SEG layer 132b is lower than the top surface of the lowermost sacrificial layer 111.

Figure 11C:
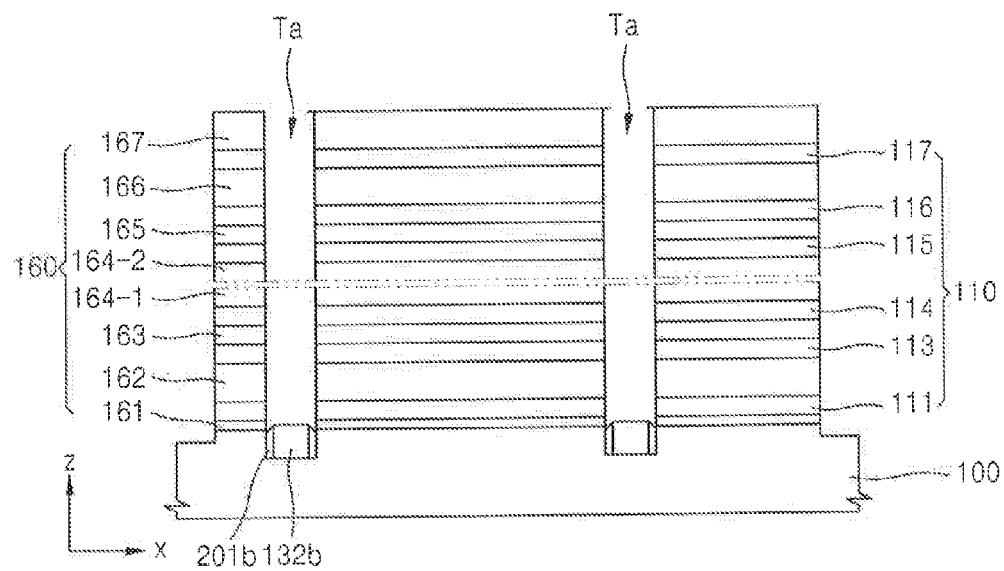

Referring to FIG. 11C, the spacer 201a that is not covered by the SEG layer 132b is removed after the forming of the SEG layer 132b. Herein, the reference numeral "201b" denotes a spacer portion that is left after the spacer removing process. By removing the spacer 201a, the side surfaces of the interlayer insulating layers 160 and the sacrificial layers 110 may be exposed again by the first openings Ta. When the top surface of the SEG layer 132b is higher than the top surface of the lowermost sacrificial layer 111, the portion of the spacer 201a at the side surface of the lowermost sacrificial layer 111 may not be removed in the spacer removing process. Accordingly, the remaining spacer portion may prevent a dielectric layer 140 from being formed on side surface of the SEG layer 132b.

Figure 11D:
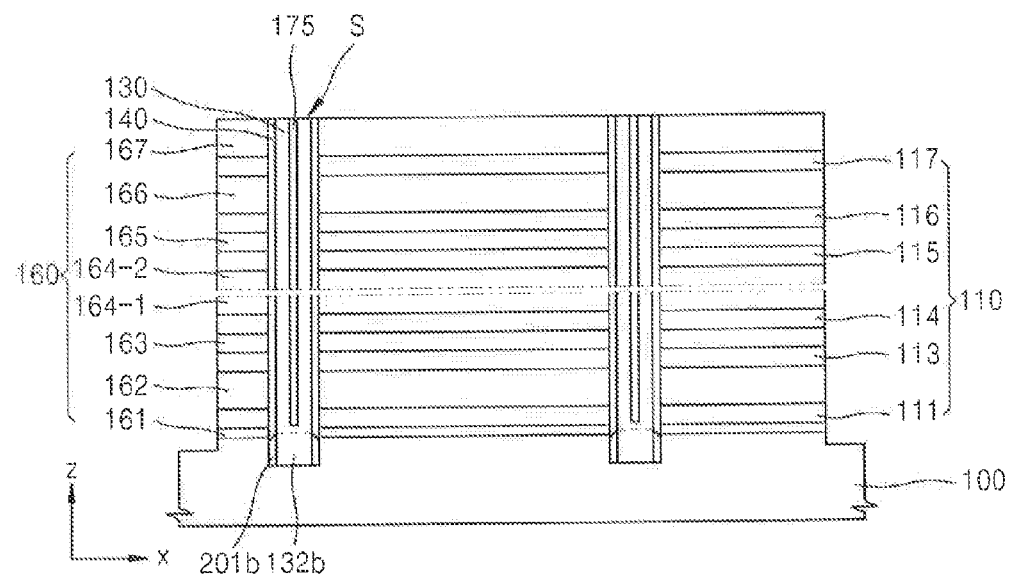

Referring to FIG. 11D, after the spacer 201a is removed, a gate dielectric layer 140, a channel region 130, and a buried insulating layer 175 are formed to form a vertical channel structure S in substantially the same manner as described with reference to FIG. 10F. The forming of the vertical channel structure S has already been described in detail with reference to FIG. 10F, and thus a description thereof will be omitted herein.

Figure 11E:
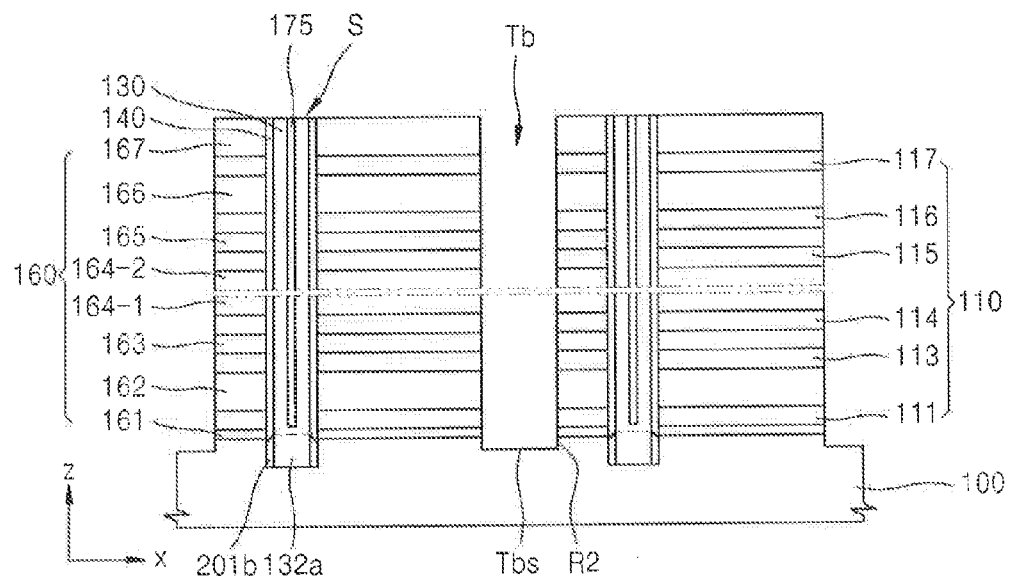

Referring to FIG. 11E, the sacrificial layers 110 and the interlayer insulating layers 160 between the first openings Ta are anisotropically etched to form second openings Tb that expose the substrate 100. The second openings Tb may be formed in the shape of a line that extends in the y direction (see FIG. 2). The second openings Tb may be formed between the vertical channel structures S.

In the second opening (Tb) forming process of the present exemplary embodiment, a recess R2 may also be formed to a predetermined depth in the substrate 100 by over-etching. By the forming of the second openings Tb, side surfaces of the sacrificial layers 110 and the interlayer insulating layers 160 may be exposed and a top surface Tbs of the recess R2 formed in the substrate 100 may be exposed.

Figure 11F:
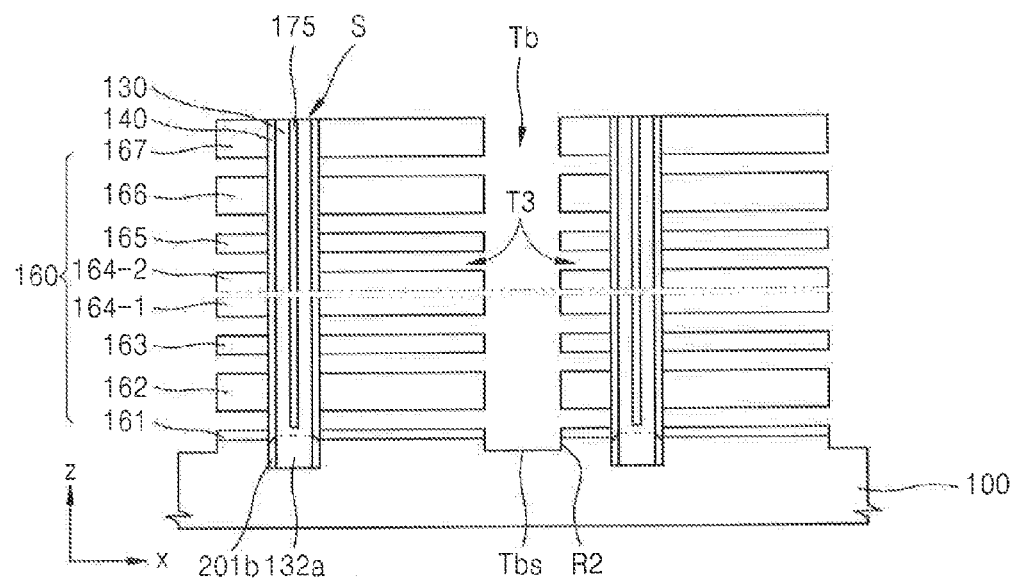

Referring to FIG. 11F, the sacrificial layers 110 exposed through the second openings Tb are removed using an etch process to form third side openings T3. The third side openings T3 may be formed by etching the sacrificial layers 110 by using an etchant that has high etch selectivity with respect to the interlayer insulating layers 160. The etch process may be performed under substantially the same conditions as the second etch process described with reference to FIG. 10I.

For example, if all the sacrificial layers 111 to 117 are formed of a polysilicon layer, the process of removing the sacrificial layers 110 may be performed under substantially the same conditions as the process of removing the second sacrificial layers 115, 116, and 117 formed of a polysilicon layer, as described with reference to FIG. 10I. The descriptions that were made with reference to FIG. 10I may be omitted.

The sacrificial layers 110 formed of a polysilicon layer may have high etch selectivity with respect to the interlayer insulating layers 160. Accordingly, the interlayer insulating layers 160 may be little etched during the etching of the sacrificial layers 110. As a result, after the sacrificial layers 110 are removed, a distance between the interlayer insulating layers 160 may be substantially equal to the initial thickness of the sacrificial layers 110.

Thereafter, as illustrated in FIGS. 10J and 10K, a gate electrode, a doped region, a common source line, an isolation insulating layer, a line insulating layer, bit line contact plugs, and a bit line may be formed to manufacture the nonvolatile memory device 1000a of FIG. 8.

Figure 12:
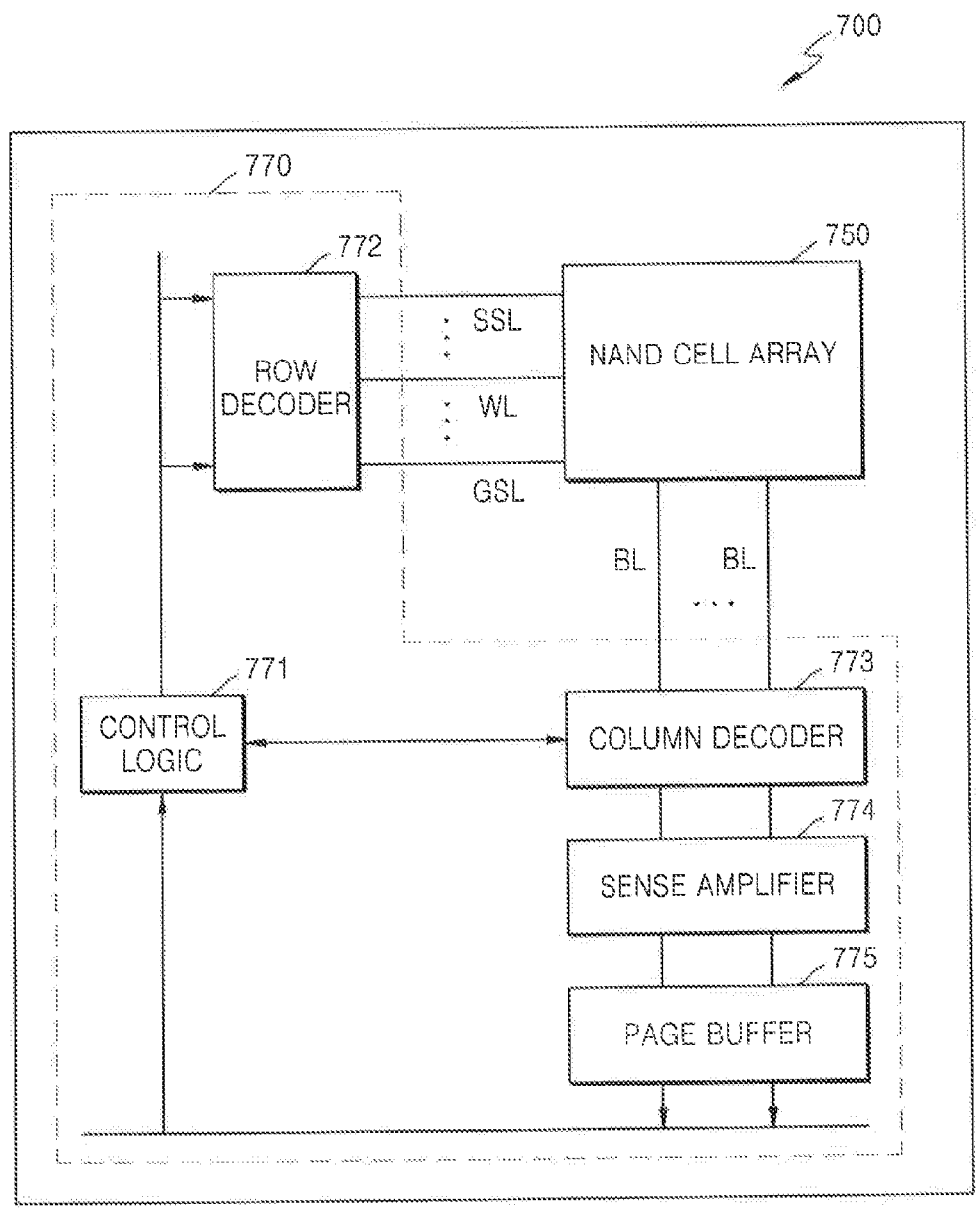
FIG. 12 is a block diagram of a vertical-type nonvolatile memory device according to another exemplary embodiment of the inventive concept.

FIG. 12 is a block diagram of a nonvolatile memory device 700 according to an exemplary embodiment of the inventive concept.

Referring to FIG. 12, in the nonvolatile memory device 700, a NAND cell array 750 may be connected to a core circuit unit 770. For example, the NAND cell array 750 may include any of the vertical-type nonvolatile memory devices illustrated in FIGS. 2 and 3C and FIGS. 5 to 9D. The core circuit unit 770 may include a control logic 771, a row decoder 772, a column decoder 773, a sense amplifier 774, and a page buffer 775.

The control logic 771 may communicate with the row decoder 772, the column decoder 773, and the page buffer 775. The row decoder 772 may communicate with the NAND cell array 750 through string selection lines SSL, word lines WL, and ground selection lines GSL. The column decoder 773 may communicate with the NAND cell array 750 through bit lines BL. The sense amplifier 774 may be connected to the column decoder 773 when a signal is output from the NAND cell array 750, and may not be connected to the column decoder 773 when a signal is transferred to the NAND cell array 750.

For example, the control logic 771 may transfer a row address signal to the row decoder 772, and the row decoder 772 may decode the row address signal and transfer the decoded row address signal to the NAND cell array 750 through the string selection lines SSL, the word lines WL, and the ground selection lines GSL. The control logic 771 may transfer a column address signal to the column decoder 773 or the page buffer 775, and the column decoder 773 may decode the column address signal and transfer the decoded column address signal to the NAND cell array 750 through the bit lines BL. A signal of the NAND cell array 750 may be transferred to the sense amplifier 774 through the column decoder 773 and amplified by the sense amplifier 774, and the amplified signal may be transferred to the control logic 771 through the page buffer 775.

Figure 13:
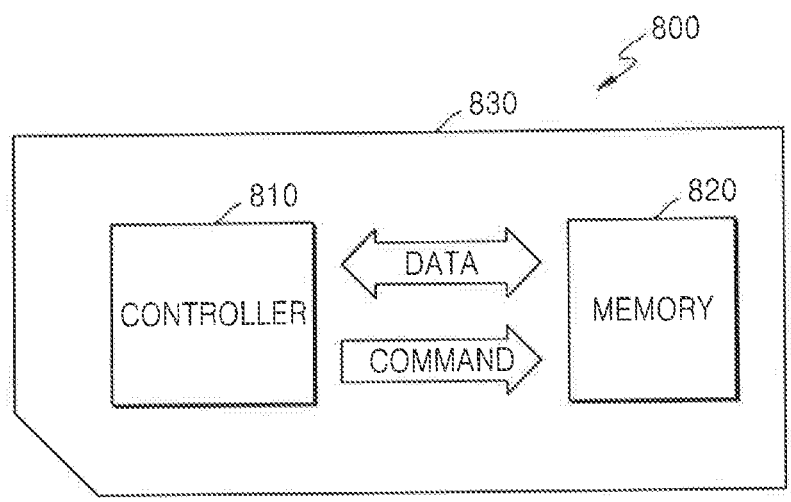
FIG. 13 is a block diagram of a memory system according to an exemplary embodiment of the inventive concept.

FIG. 13 is a block diagram of a memory system 800 according to an exemplary embodiment of the inventive concept.

Referring to FIG. 13, the memory system 800 may include a controller 810 and a memory 820 that are installed in a housing 830. The controller 810 and the memory 820 may exchange electrical signals with each other. For example, the memory 820 and the controller 810 may communicate data with each other according to a command of the controller 810. Accordingly, the memory system 800 may store data in the memory 820 or output data from the memory 820 to the outside.

For example, the memory 820 may include the vertical-type nonvolatile memory devices illustrated in FIGS. 2 and 3C and FIGS. 5 to 9D. The memory system 800 may be used as a data storage medium of various portable devices. For example, the memory system 800 may include a multimedia card (MMC), a secure digital card (SD), or a solid state disk (SSD).

Figure 14:
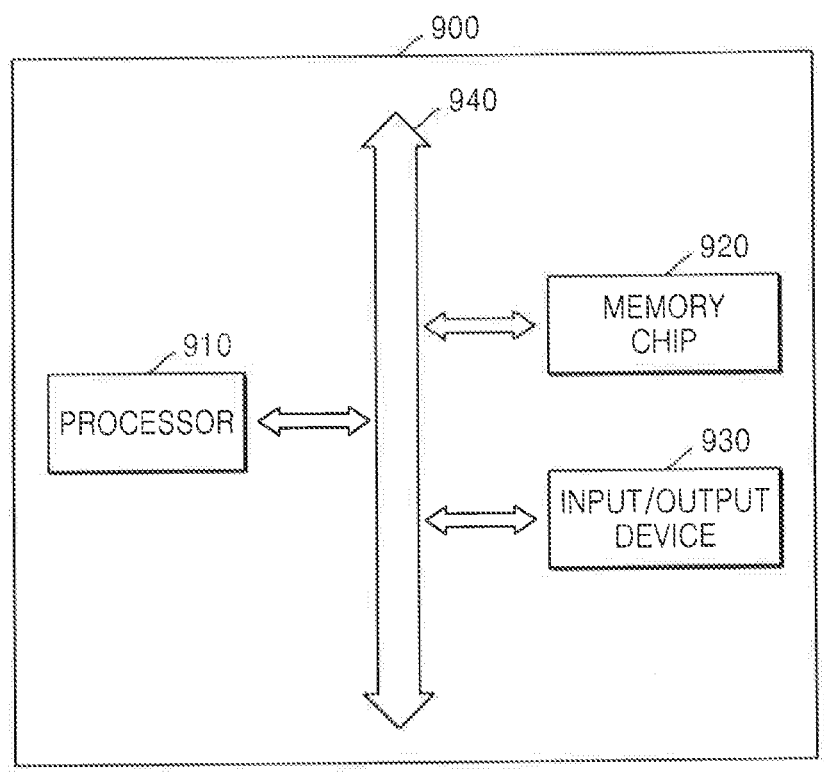
FIG. 14 is a block diagram of an electronic system according to an exemplary embodiment of the inventive concept.

FIG. 14 is a block diagram of an electronic system 900 according to an exemplary embodiment of the inventive concept.

Referring to FIG. 14, the electronic system 900 may include a processor 910, an input/output device 930, and a memory chip 920 that may communicate data with each other through a bus 940. The processor 910 may execute a program and control the electronic system 900. The input/output device 930 may be used to input or output data of the electronic system 900. By using the input/output device 930, the electronic system 900 may be connected to an external device, for example, a personal computer or a network to exchange data with the external device. The memory chip 920 may store codes and data for operation of the processor 910. For example, the memory chip 920 may include any one of the vertical-type nonvolatile memory devices illustrated in FIGS. 2 and 3C and FIGS. 5 to 9D.

The electronic system 900 may constitute various electronic control devices that need the memory chip 920. For example, the electronic system 900 may be used in mobile phones, MP3 players, navigation devices, SSDs, and household appliances.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A vertical-type nonvolatile memory device comprising:
   a first vertical channel structure that extends vertically on a substrate;
   a first stacked structure including a plurality of first sacrificial layers and a plurality of first interlayer insulating layers,
      wherein the plurality of first sacrificial layers and the plurality of first interlayer insulating layers are alternately and vertically stacked on each other,
      wherein the first stacked structure is disposed on a first sidewall of the first vertical channel structure, and
      wherein the plurality of first sacrificial layers is formed of a polysilicon layer; and
   a second stacked structure including a plurality of gate electrodes and a plurality of second interlayer insulating layers,
      wherein the plurality of gate layers and the plurality of second interlayer insulating layers are alternately and vertically stacked on each other,
      wherein the second stacked structure is disposed on a second sidewall of the first vertical channel structure.

2. The vertical-type nonvolatile memory device of claim 1,
   wherein the plurality of the gate electrodes is formed of at least one of a metal layer and a metal silicide layer.

3. The vertical-type nonvolatile memory device of claim 1, further comprising a second vertical channel structure that extends vertically on the substrate,
   wherein the second vertical channel structure is spaced apart from the first vertical channel structure in a first direction.

4. The vertical-type nonvolatile memory device of claim 3, further comprising an isolation insulating layer extending in second direction crossing the first direction,
   wherein the substrate includes a device region and a dummy region,
   wherein the isolation insulating layer is disposed between the device and dummy regions,
   wherein the first and second stacked structures and the first vertical channel structure are disposed on the dummy region, and the second vertical channel structure is disposed on the device region.

5. The vertical-type nonvolatile memory device of claim 4, wherein the substrate further includes a connection region, and
   wherein the plurality of gate electrodes disposed in the dummy region is extended to the connection region so that each of the plurality of gate electrodes is connected to a corresponding word line through a vertical contact.

6. The vertical-type nonvolatile memory device of claim 1,
   wherein the first stacked structure further includes a plurality of second sacrificial layers and a plurality of third interlayer insulating layers,
   wherein the plurality of second sacrificial layers is formed of at least one of a nitride layer and an oxide layer,
   wherein the plurality of second sacrificial layers and the plurality of third interlayer insulating layers are alternately and vertically stacked on each other,
   wherein the plurality of first sacrificial layers is disposed on the plurality of second sacrificial layers,
   wherein the plurality of first interlayer insulating layer is disposed on the plurality of third interlayer insulating layer, and
   wherein the plurality of first and third interlayer insulating layers is formed of a same kind of an insulating material.

7. The vertical-type nonvolatile memory device of claim 6,
   wherein the plurality of the second interlayer insulating layers includes a lower second interlayer insulating layer and an upper second interlayer insulating layer,
   wherein the lower second interlayer insulating layer is adjacent to a corresponding first interlayer insulating layer of the plurality of the first interlayer insulating layers and is thinner than the corresponding first interlayer insulating layer, and
   wherein the upper second interlayer insulating layer is adjacent to a corresponding first interlayer insulating layer of the plurality of the first insulating layer and has a substantially same thickness as the corresponding first interlayer insulating layer.

8. The vertical-type nonvolatile memory device of claim 7,
   wherein the plurality of gate electrodes in the second stacked structure includes a lower gate electrode and an upper gate electrode,
   wherein the lower gate electrode is adjacent to a corresponding second sacrificial layer of the plurality of second sacrificial layers and is thicker than the corresponding second sacrificial layer, and
   wherein the upper gate electrode is adjacent to a corresponding first sacrificial layer of the plurality of first sacrificial layer and a thickness of the upper gate electrode is substantially similar to a thickness of the corresponding first sacrificial layer.

9. The vertical-type nonvolatile memory device of claim 1, further comprising an aluminum layer interposed between the first vertical channel structure and the plurality of gate electrodes in the first stacked structure, wherein the first vertical channel structure comprises a silicon layer.

10. The vertical-type nonvolatile memory device of claim 9, further comprising: a selective epitaxial growth (SEG) layer interposed between a bottom surface of the first vertical channel structure and the substrate, wherein the SEG layer is an epitaxial layer that is grown from the substrate.

11. The vertical-type nonvolatile memory device of claim 10, wherein a top surface of the SEG layer is lower than a bottom surface of a lowermost gate electrode of the plurality of gate electrodes.

12. The vertical-type nonvolatile memory device of claim 10, wherein the SEG layer includes curved sidewall surfaces.

13. The vertical-type nonvolatile memory device of claim 4, further comprising: a common source line disposed underneath the isolation insulating layer, wherein a width of the common source line is greater than a width of the isolation insulating layer.

14. A vertical-type nonvolatile memory device comprising:
a cell region including a device region, a dummy region and an isolation insulating layer,
wherein the cell region includes a plurality of gate electrodes and a plurality of first interlayer insulating layers that are vertically and alternately stacked on each other and a first vertical channel structure,
wherein the gate electrodes are in contact with the first vertical channel structure,
wherein the dummy region is adjacent to one side of the device region, and the dummy region includes a plurality of conductive layers and a plurality of second interlayer insulating layers that are vertically and alternately stacked on each other and a second vertical channel structure,
wherein the conductive layers are in contact with the second vertical channel structure,
wherein a material of the plurality of conductive layers is different from a material of the plurality of gate electrodes,
wherein a material of the plurality of first interlayer insulating layers is substantially the same as a material of the plurality of second interlayer insulating layer,
wherein the isolation insulating layer is interposed between the device region and the dummy region.

15. The vertical-type nonvolatile memory device of claim 14,
wherein the plurality of conductive layers is formed of a polysilicon layer.

16. The vertical-type nonvolatile memory device of claim 14,
wherein the cell region further includes a connection region, wherein the connection region includes a first connection region adjacent to another side of the device region and a second connection region adjacent to the dummy region, wherein the isolation insulating layer is interposed between the first and second connection regions.

* * * * *